(12) United States Patent
Saito et al.

(10) Patent No.: US 6,873,324 B2
(45) Date of Patent: Mar. 29, 2005

(54) DATA PROCESSING METHOD, RECORDING MEDIUM AND DATA PROCESSING APPARATUS

(75) Inventors: Yasuhiko Saito, Hachioji (JP); Masahiro Kainaga, Kokubunji (JP); Koji Yamada, Machida (JP)

(73) Assignee: Hitachi, Ltd., Tokyo (JP)

( * ) Notice: Subject to any disclaimer, the term of this patent is extended or adjusted under 35 U.S.C. 154(b) by 608 days.

(21) Appl. No.: 09/886,281

(22) Filed: Jun. 22, 2001

(65) Prior Publication Data

US 2001/0055032 A1 Dec. 27, 2001

(30) Foreign Application Priority Data

Jun. 23, 2000 (JO) ........................................ 2000-194935

(51) Int. Cl.$^7$ ............................................. G06T 15/00
(52) U.S. Cl. ........................................ 345/419; 345/423
(58) Field of Search ................................. 345/427, 423, 345/428, 473, 419, 420, 421, 422, 424, 426

(56) References Cited

U.S. PATENT DOCUMENTS

| | | | | |
|---|---|---|---|---|
| 5,546,515 A | * | 8/1996 | Mochizuki | 345/606 |
| 5,689,627 A | * | 11/1997 | Arai et al. | 345/423 |
| 6,072,496 A | * | 6/2000 | Guenter et al. | 345/419 |
| 6,184,887 B1 | * | 2/2001 | Rohner | 345/419 |
| 6,208,347 B1 | * | 3/2001 | Migdal et al. | 345/419 |
| 6,236,404 B1 | * | 5/2001 | Iimura et al. | 345/427 |
| 6,249,286 B1 | * | 6/2001 | Dyer | 345/419 |
| 6,262,739 B1 | * | 7/2001 | Migdal et al. | 345/423 |
| 6,373,489 B1 | * | 4/2002 | Lu et al. | 345/428 |
| 6,400,365 B1 | * | 6/2002 | Setoguchi | 345/427 |
| 6,405,151 B1 | * | 6/2002 | Fujii et al. | 702/155 |
| 6,441,819 B1 | * | 8/2002 | Suzuoki | 345/423 |
| 6,515,673 B1 | * | 2/2003 | Hashimoto et al. | 345/582 |

* cited by examiner

*Primary Examiner*—Mark Zimmerman
*Assistant Examiner*—Enrique L. Santiago
(74) *Attorney, Agent, or Firm*—Antonelli, Terry, Stout & Kraus, LLP

(57) ABSTRACT

A data processing method for compressing vertex coordinate data of a plurality of polygons approximating a three-dimensional shape of an image, an apparatus therefor, and a program recording medium therefor. Vertexes of a plurality of polygons approximating a three-dimensional shape of an image are divided into a plurality of vertex sets. A reference point is defined for each of the vertex sets. As positional information of each vertex in each of the vertex sets, differential data between the coordinates of the vertex and the coordinates of the reference point is obtained as an integer value indicating the magnitude relative to a predetermined scale value. The coordinate data of the reference point and the differential data in each of the vertex sets are compressed data.

14 Claims, 14 Drawing Sheets

FIG.3A

INTEGER DIFFERENTIAL EXPRESSION OF IN-CLUSTER COORDINATES
(REFERENCE POINT=V3)

| VERTEX | X-COMPONENT | Y-COMPONENT | Z-COMPONENT |
|---|---|---|---|
| V1 | Int (x1-x3) | Int (y1-y3) | Int (z1-z3) |
| V2 | Int (x2-x3) | Int (y2-y3) | Int (z2-z3) |
| V3 | x3 | y3 | z3 |
| V4 | Int (x4-x3) | Int (y4-y3) | Int (z4-z3) |
| V5 | Int (x5-x3) | Int (y5-y3) | Int (z5-z3) |

FIG.3B

FLOATING POINT DIFFERENTIAL EXPRESSION OF IN-CLUSTER COORDINATES
(REFERENCE POINT=V3)

| VERTEX | X-COMPONENT | Y-COMPONENT | Z-COMPONENT |
|---|---|---|---|
| V1 | x1-x3 | y1-y3 | z1-z3 |
| V2 | x2-x3 | y2-y3 | z2-z3 |
| V3 | x3 | y3 | z3 |
| V4 | x4-x3 | y4-y3 | z4-z3 |
| V5 | x5-x3 | y5-y3 | z5-z3 |

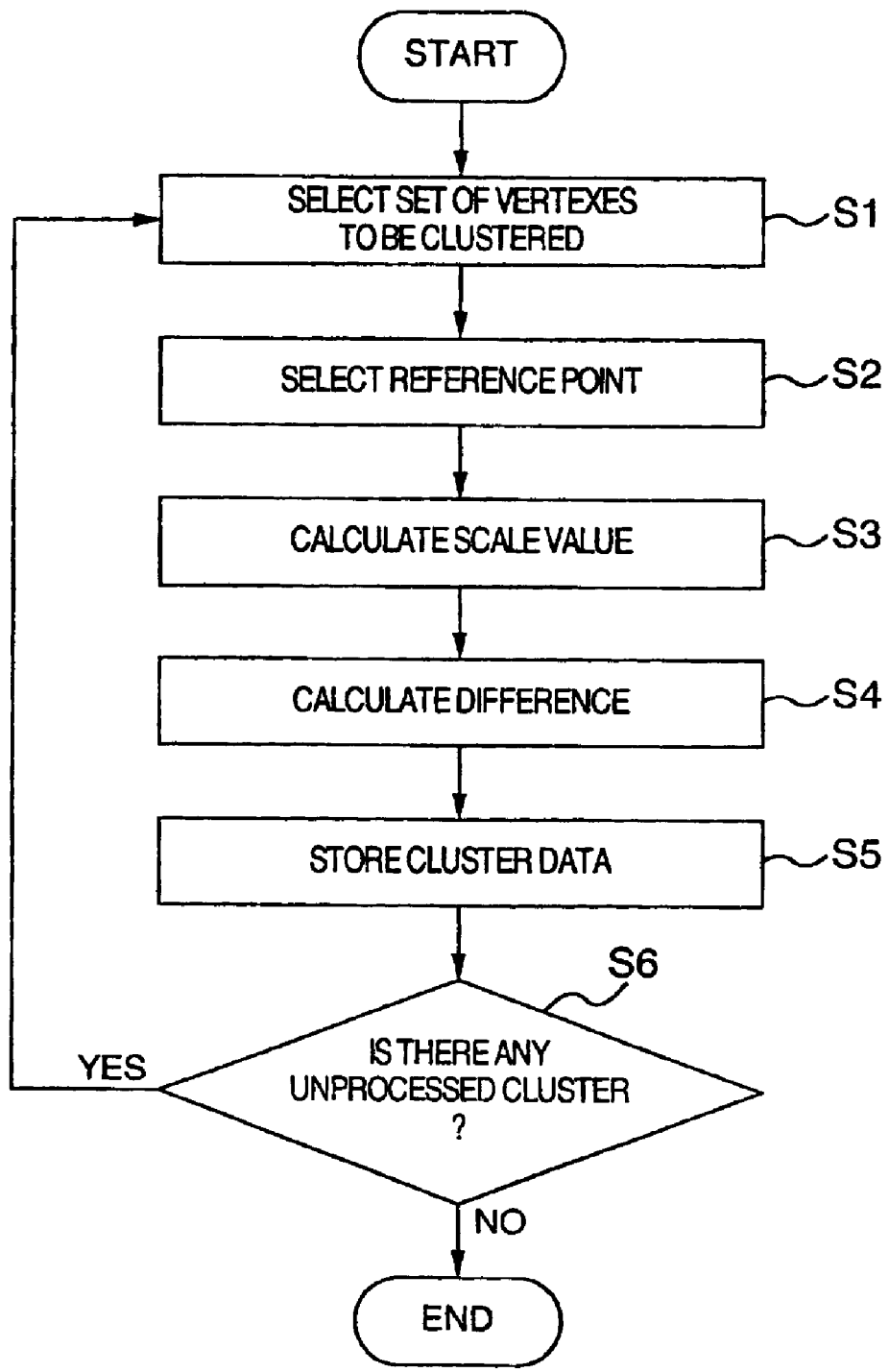

| AFFINE TRANSFORMATION : W = M*V + P | ··· EXPRESSION (1) |

$$\begin{pmatrix} tx \\ ty \\ tz \end{pmatrix} = \begin{pmatrix} m11 & m12 & m13 \\ m21 & m22 & m23 \\ m31 & m32 & m33 \end{pmatrix} \begin{pmatrix} x \\ y \\ z \end{pmatrix} + \begin{pmatrix} p \\ q \\ r \end{pmatrix} \quad \cdots \text{EXPRESSION (2)}$$

FIG.7A

COORDINATE DIFFERENTIAL EXPRESSION BEFORE AFFINE TRANSFORMATION (REFERENCE POINT=V1)

| VERTEX | X-COMPONENT | Y-COMPONENT | Z-COMPONENT |
|---|---|---|---|
| V1 | X-COMPONENT OF V1 | Y-COMPONENT OF V1 | Z-COMPONENT OF V1 |
| V2 | X-COMPONENT OF dV2 | Y-COMPONENT OF dV2 | Z-COMPONENT OF dV2 |

FIG.7B

COORDINATE DIFFERENTIAL EXPRESSION AFTER AFFINE TRANSFORMATION (REFERENCE POINT=W1)

| VERTEX | X-COMPONENT | Y-COMPONENT | Z-COMPONENT |
|---|---|---|---|
| W1 | X-COMPONENT OF M*V1+P | Y-COMPONENT OF M*V1+P | Z-COMPONENT OF M*V1+P |
| W2 | X-COMPONENT OF M*dV2 | Y-COMPONENT OF M*dV2 | Z-COMPONENT OF M*dV2 |

| | |
|---|---|
| $A = z0/z1$ | EXPRESSION 1 |
| $B = z0/(z1*z1)$ | EXPRESSION 2 |
| $px1 = A*x1$ | EXPRESSION 3 |
| $py1 = A*y1$ | EXPRESSION 4 |
| $px2 = (A - B*dz2)*(x1 + dx2)$ | EXPRESSION 5 |
| $py2 = (A - B*dz2)*(x1 + dy2)$ | EXPRESSION 6 |
| $D = z0/(z1 + dz)$ | EXPRESSION 7 |
| $px = D*(x1 + dx)$ | EXPRESSION 8 |
| $py = D*(y1 + dy)$ | EXPRESSION 9 |
| $\dfrac{1}{z+dz} = \dfrac{1}{z} - \dfrac{1}{z^2}dz + \dfrac{1}{z^3}dz^2 - \dfrac{1}{z^4}dz^3 + \cdots$ | EXPRESSION 10 |
| $\dfrac{z0}{z1+dz2} = \dfrac{z0}{z1} - \dfrac{z0}{z1^2}*dz2$ | EXPRESSION 11 |

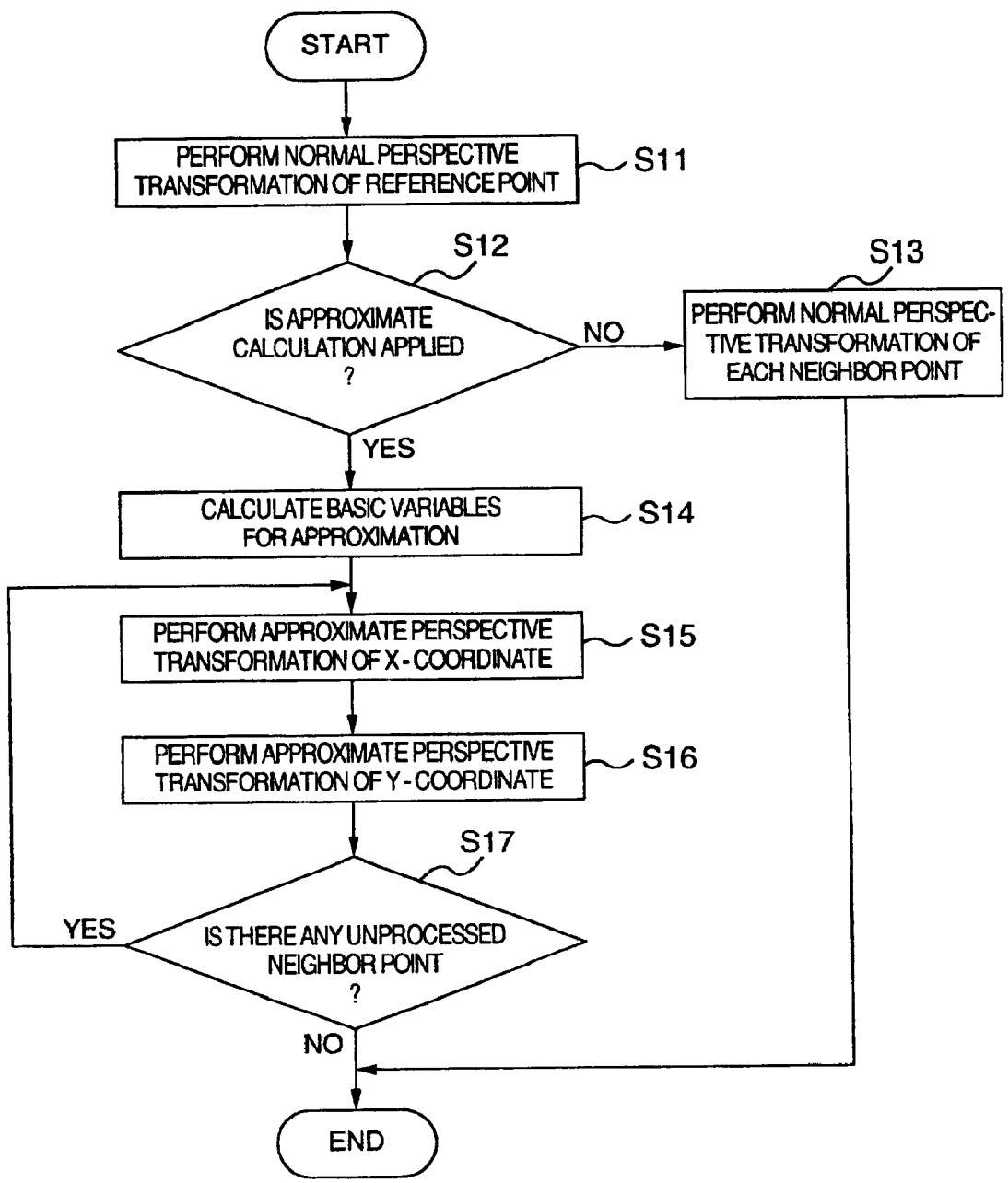

| INTEGER DIFFERENTIAL EXPRESSION OF IN-CLUSTER COORDINATES (REFERENCE POINT=P) | | | |
|---|---|---|---|
| VERTEX | X-COMPONENT | Y-COMPONENT | Z-COMPONENT |
| V1 | Int (x1-x0) | Int (y1-y0) | Int (z1-z0) |
| V2 | Int (x2-x0) | Int (y2-y0) | Int (z2-z0) |
| V3 | Int (x3-x0) | Int (y3-y0) | Int (z3-z0) |
| V4 | Int (x4-x0) | Int (y4-y0) | Int (z4-z0) |
| V5 | Int (x5-x0) | Int (y5-y0) | Int (z5-z0) |

DATA PROCESSING METHOD, RECORDING MEDIUM AND DATA PROCESSING APPARATUS

BACKGROUND OF THE INVENTION

The present invention relates to a method for image processing such as data compression/expansion technique, affine transformation, perspective transformation, and so on, of image data such as three-dimensional (hereinafter referred to as "3D") graphics data or the like, and a recording medium for image data or programs.

In fields using 3D graphics such as games, movies, etc., there is a tendency that the demands for high-definition high-speed image processing become higher and higher every year. Thus, operation capacity required as image processors and data quantity processed by the image processors have increased year by year.

In such 3D graphics fields, any 3D object is expressed by an assembly of polygons, and image processing is applied to the polygons. As a reference about image processing for polygons, there is a literature "Fundamentals of Interactive Computer Graphics (by J. D. Foley and A. Van Dam)", PP. 274–279, PP. 505–511, and PP. 552–557 Addison-Wesley Publishing, 1982.

As a system for showing an object expressed by polygons in high definition and smoothly, it is considered to cut the polygons forming the object into smaller parts to thereby increase the number of required polygons. However, the data quantity and the operation quantity increase as the number of polygons is increased.

The increase in operation quantity can be coped with by improving the processing capacity of a processor. On the contrary, for the increase in data quantity, it is necessary to increase the capacity of a recording medium which records image data, or to expand data transfer width (number of parallel transfer data bits) between a memory and the processor, or the like. However, the gap between the data processing capacity of a processor and the data transfer capacity through a bus between an external memory and the processor shows a tendency to expand. Even if the processing capacity of the processor is sufficient, the data transfer capacity through the bus cannot follow the processor. Thus, the data transfer capacity may determine the total data processing performance.

As a background art, there is known a method in which data to be processed by a processor is compressed and stored in a memory or a recording medium in advance, and the compressed data is expanded immediately before the data is processed by the processor. For example, as 3D image data, particularly as a compressed data structure of polygon data, there is known a compression system defined by "JAVA 3D" (3D Geometry Compression in Appendix B of the public data "Java 3D API Specification (Version 1.1.2, June 1999)" in the public homepage "http://java.sun.com/products/java-media/3D" of SUN MICROSYSTEMS INC.), PP. 1/6–6/6.

In the aforementioned "Java 3D", some kinds of instructions are made to correspond to individual vertexes forming polygons. These are variable-length instructions. Each of the instructions has data of coordinates, a color, a normal line, etc., of a vertex in the form of a differential value with respect to a point processed previously. The data as a whole is then subjected to variable-length compression. Thus, the transfer time in network communication can be shortened.

However, according to the compression system of "Java 3D", in order to expand compressed information, it is necessary to reconstitute polygons while interpreting and expanding such instructions sequentially. Because it is necessary to expand the variable-length compressed data sequentially, there is a tendency for the expansion processing to be slow.

In addition, as disclosed in JP-A-11-259680, there is a technique in which polygon differential data with respect to a reference image are made up based on the comparison of two temporally continuous planes of image data so that the data quantity is reduced by storing the differential data with respect to the reference image data. This technique is to reduce the data quantity describing the motion of images, but it is not to reduce the static data quantity of the images.

SUMMARY OF THE INVENTION

It is an object of the present invention to provide a data compression method and a data expansion method in which compression can be performed easily on vertex data of polygons and an excessive load is not applied to a processor or the like in the processing for expanding the compressed data.

It is another object of the present invention to provide a data processing method which can contribute to increase in the speed of 3D image processing such as affine transformation, perspective transformation, and so on, in relation to a data compression structure concerning vertex data of polygons.

It is a further object of the present invention to provide a recording medium of programs which can realize easily the data compression method and the data expansion method, and further the data processing method which can contribute to increase in the speed of affine transformation, perspective transformation, and so on.

It is a still further object of the present invention to provide a recording medium recording a data structure of polygons or data thereof desirably for increasing the speed of 3D image processing such as affine transformation, perspective transformation, and so on.

It is another object of the present invention to provide a data processing apparatus which can contribute to increase in the speed of 3D image processing such as affine transformation, perspective transformation, and so on, in relation to a data compression structure concerning vertex data of polygons.

The aforementioned and other objects and novel features of the present invention will be made clear in the following description of this specification and the accompanying drawings.

A representative summary of the invention disclosed in this specification will be described below briefly.

I. <<Compression Method>>

The compressed data structure of polygon data is set as follows. First, a complicated 3D object is analyzed into an assembly of parts such as simpler rigid bodies. For example, when a human body is expressed by polygons, the human body is analyzed into parts such as a face, arms, elbows, etc. A set of vertexes forming a plurality of polygons included in each of such parts is referred to as a "cluster". If the number of polygons is increased, a plurality of vertexes forming each part are located spatially close to one another. In consideration of this fact, a reference point is determined for every set of vertexes spatially close to one another, and relative vectors between the respective vertexes and the reference point are taken consideration. In this case, because the distance of each vertex from the reference point is short, each component of the vertex can be expressed by, for example, one byte of integer value. Thus, the data quantity can be compressed into about a quarter in comparison with conventional information in which geometric information of each polygon has coordinate values of vertex coordinates each of which is expressed by a 4-byte floating point relative to one origin.

The data processing method paying attention to such data compression is a method for compressing vertex coordinate data of a plurality of polygons approximating a 3D shape of an image. The data processing method comprises a first step of dividing vertexes of a plurality of polygons approximating a 3D shape of an image into a plurality of vertex sets (V1 to V5), a second step of determining a reference point (V3, P) for each of the vertex sets, a third step of obtaining, for every vertex set, differential data between the coordinates of each vertex and the coordinates of the reference point of the vertex set as positional information of the vertex, and a fourth step of storing, as compressed data, the coordinate data of the reference point and the differential data in each of the vertex sets.

Even if the coordinates of the vertexes and the coordinates of the reference point are provided in a type of floating point data, differences between the coordinates of the vertexes and the coordinates of the reference point can be obtained, as the aforementioned differential data in the third step, in a type of integer values showing magnitude relative to a predetermined scale value. For example, to express the differential data by a 1-byte signed integer (value 0 to 127), it will go well if a quotient obtained by dividing the maximum value of the distance between a vertex and a reference point thereof by 127 is set as a scale value, and a quotient obtained by dividing the differential value between the coordinates of the vertex and the coordinates of the reference point by the scale value is set as differential data.

For every vertex set, a vertex close to a barycentric point obtained from the coordinates of respective vertexes of the vertex set, or the barycentric point itself may be set as a reference point for the set of vertexes. Thus, a reference point located closely to each vertex can be determined easily.

II. <<Expansion>>

To expand the data compressed in the aforementioned method, the following means is adopted. The compressed data has a regular structure for every vertex. For example, expansion processing can be achieved by type conversion processing from integer type data to floating point number type data, and multiplication processing by the scale value. This expansion processing method can be performed easily and at a high speed, and the cost of a special-purpose expansion apparatus can be reduced. Further, if a comparatively simple expansion instruction is defined in a processor, data expansion can be achieved at a speed corresponding to the processing performance of the processor.

In more particular, the data expansion processing method comprises a first step of inputting coordinate data of a reference point in a type of floating point number for a set of vertexes of a plurality of polygons approximating a 3D shape of an image, differential data of a difference between coordinates of each of the vertexes and coordinates of the reference point in a type of integer, and scale value data for providing a reference of magnitude of the differential data in a type of floating point number; a second step of type-converting the inputted differential data into floating point numbers; a third step of multiplying the type-converted differential data by the scale value data; and a fourth step of storing a multiplication result of the third step as expanded differential data.

A data processing apparatus according to the present invention for implementing such a data expansion method comprises storage means which can store coordinate data of a reference point in a type of floating point number for a set of vertexes of a plurality of polygons approximating a 3D shape of an image, differential data of a difference between coordinates of each of the vertexes and coordinates of the reference point in a type of integer, and scale value data for providing a reference of magnitude of the differential data in a type of floating point number. In addition, the data processing apparatus has operation control means for receiving the differential data read out from the storage means, type-converting the received differential data into floating point numbers, multiplying the type-converted differential data by the scale value data, and outputting a multiplication result as expanded differential data.

For example, the operation control means is a CPU. The CPU can execute an instruction to type-convert integer data into floating point number data. This instruction of type-conversion has a bit-length information field indicating bit length of the integer data. Bit-length extension processing is carried out in accordance with a difference between the bit length of integer data and the bit length of the mantissa of a predetermined floating point format in the aforementioned type conversion. Bit-length information of integer data required for the bit-length extension processing can be obtained from the decoding result of the aforementioned instruction. Thus, even if integer data different in bit length are mixed, it is possible to carry out processing with the aforementioned type conversion by one instruction. In comparison with the case where bit-length information of integer data to be processed is assigned by a control register, it is not necessary to carry out an extra register access operation whenever there is a change in the bit length of the integer data to be processed. Thus, the data processing efficiency is improved.

III. <<Data Recording Medium>>

The image data compressed into the differential data can be recorded and provided in a computer-readable recording medium. For example, image data recorded in such a recording medium include coordinate data of a reference point for a set of vertexes of a plurality of polygons approximating a 3D shape of an image, and differential data between coordinates of each of the vertexes and coordinates of the reference point. The coordinate data of the reference point is floating point data, and the differential data is integer value data indicating magnitude relative to a predetermined reference value. The reference point is coordinate data of a barycentric point obtained from the coordinates of the respective vertexes contained in the set of vertexes of the plurality of polygons, or coordinate data of a vertex close to the barycentric point.

If the image data compressed into the differential data is recorded and provided in the recording medium, image processing is carried out with the data. Thus, the expansion of the compressed data can be done without lowering the image processing performance of the processor, and the cost for the recording medium and data transfer can be reduced.

IV. <<Affine Transformation>>

To increase the speed of the 3D image processing using the expanded data structure, the expanded data of each vertex is expressed by a differential vector from the reference point, and each component is, for example, formed into 4-byte floating point type data. In the "affine transformation" of vertexes constituting a cluster, linear transformation excluding parallel displacement is applied to the differential vector of each vertex from the reference point. Thus, the operation quantity can be reduced.

In more particular, in a data processing method for carrying out such affine transformation coordinate data of a reference point in a type of floating point number for a set of vertexes of a plurality of polygons approximating a 3D shape of an image, and differential data of a difference between coordinates of each of the vertexes and coordinates of the reference point in a type of floating point number are supplied. Data which is obtained by expanding the aforementioned compressed data structure is assumed as the differential data. Then, when affine transformation is to be carried out upon the inputted coordinate data of the reference point, linear transformation in which parallel displacement is excluded from the affine transformation is carried out upon coordinate data of the vertexes sharing the reference point.

A program for supporting the implementation of such a data processing method can be recorded and provided in a computer-readable recording medium. The program makes a computer input coordinate data of a reference point in a type of floating point number for a set of vertexes of a plurality of polygons approximating a 3D shape of an image, and differential data of a difference between coordinates of each of the vertexes and coordinates of the reference point in a type of floating point number. While carrying out affine transformation upon the inputted coordinate data of the reference point, the program makes the computer carry out linear transformation, in which parallel displacement has been excluded from the affine transformation, upon coordinate data of the vertexes sharing the reference point.

A data processing apparatus to which such a data processing method is applied comprises storage means which can store coordinate data of a reference point in a type of floating point number for a set of vertexes of a plurality of polygons approximating a 3D shape of an image, and differential data of a difference between coordinates of each of the vertexes and coordinates of the reference point in a type of floating point number; and operation means for carrying out affine transformation upon the coordinate data of the reference point read out from said storage means while linear transformation in which parallel displacement is excluded from the affine transformation is carried out upon coordinate data of the vertexes sharing the reference point.

V. <<Perspective Transformation>>

To increase the speed of the 3D image processing using the expanded data structure, approximate processing of perspective transformation is carried out. That is, vertexes contained in a set of vertexes sharing a reference point is spatially close to one another. Therefore, the perspective transformation of each of such vertexes is approximated by the operation of combination of multiplication and addition using the perspective transformation result corresponding to the reference point. Thus, the division processing required for perspective transformation can be reduced. This approximation is effective in the processing with a processor in which it takes more time for division processing than for multiplication or addition processing.

In more particular, in a data processing method for carrying out such perspective transformation, coordinate data of a reference point in a type of floating point number for a set of vertexes of a plurality of polygons approximating a 3D shape of an image, and differential data of a difference between coordinates of each of the vertexes and coordinates of the reference point in a type of floating point number are supplied. When perspective transformation is to be carried out upon the vertexes of the plurality of polygons, perspective transformation based on division using a geometric relationship of similarity is carried out upon the reference point so as to obtain perspective-transformed coordinate data of the reference point, while perspective-transformed coordinate data of each of the vertexes other than the reference point is obtained by use of the perspective-transformed coordinate data of the reference point and the differential data in accordance with approximate calculation based on Maclaurin series expansion.

In the approximate calculation of the perspective transformation, when a distance between a coordinate origin and a perspective plane for the perspective transformation is smaller than a predetermined value, an error caused by the approximate calculation cannot be ignored. In such a case, the perspective transformation based on division using a geometric relationship of similarity may be carried out also upon the coordinate data of vertexes other than the reference point.

A program for supporting the implementation of such a data processing method can be recorded and provided in a computer-readable recording medium. The program makes a computer input coordinate data of a reference point in a type of floating point number for a set of vertexes of a plurality of polygons approximating a 3D shape of an image, and differential data of a difference between coordinates of each of the vertexes and coordinates of the reference point in a type of floating point number. When perspective transformation is carried out upon the vertexes of the plurality of polygons, the perspective transformation based on division using a geometric relationship of similarity is carried out upon the inputted coordinate data of the reference point so as to obtain the perspective-transformed coordinate data of the reference point. On the other hand, for each of the inputted vertexes other than the reference point, perspective-transformed coordinate data is obtained by use of the perspective-transformed coordinate data of the corresponding reference point in accordance with approximate calculation based on Maclaurin series expansion.

A data processing apparatus to which such a data processing method is applied comprises storage means which can store coordinate data of a reference point in a type of floating point number for a set of vertexes of a plurality of polygons approximating a 3D shape of an image, and differential data of a difference between coordinates of each of the vertexes and coordinates of the corresponding reference point in a type of floating point number. Further, the data processing apparatus has operation means for carrying out perspective transformation upon the vertexes of the plurality of polygons in the following manner. That is, perspective transformation based on division using a geometric relationship of similarity is carried out upon the coordinate data of the reference point stored in the storage means so as to obtain perspective-transformed coordinate data of the reference point, while approximate calculation for the perspective transformation is carried out upon the coordinate data of the vertexes other than the reference point stored in the storage means on the basis of Maclaurin series expansion using the perspective-transformed coordinate data of the reference point so as to obtain perspective-transformed coordinate data of the vertexes when a distance between a perspective plane for the perspective transformation and the reference point is larger than a predetermined value, or while perspective transformation based on division using a geometric relationship of similarity is also carried out upon the coordinate data of the vertexes other than the reference point stored in the storage means so as to obtain perspective-transformed coordinate data of the vertexes when the distance between the perspective plane for the perspective transformation and the reference point is smaller than the predetermined value.

BRIEF DESCRIPTION OF THE DRAWINGS

FIGS. 2A to 2D are explanatory views showing an example of cluster data constituted by vertex data compressed into differential data, and so on;

FIGS. 3A and 3B are explanatory views showing data differential expressions for in-cluster vertex coordinates by way of example;

FIG. 5 is a flow chart showing an example of a compression method to integer differential data;

FIGS. 7A and 7B are explanatory views showing vertex data based on coordinate differential expression before affine transformation in FIG. 6A and vertex data based on coordinate differential expression after the affine transformation by way of example;

FIG. 9 is a flow chart showing the perspective transformation method using expanded floating point differential data by way of example;

DESCRIPTION OF THE EMBODIMENTS

<<Image Processing System>>

Figure 4:
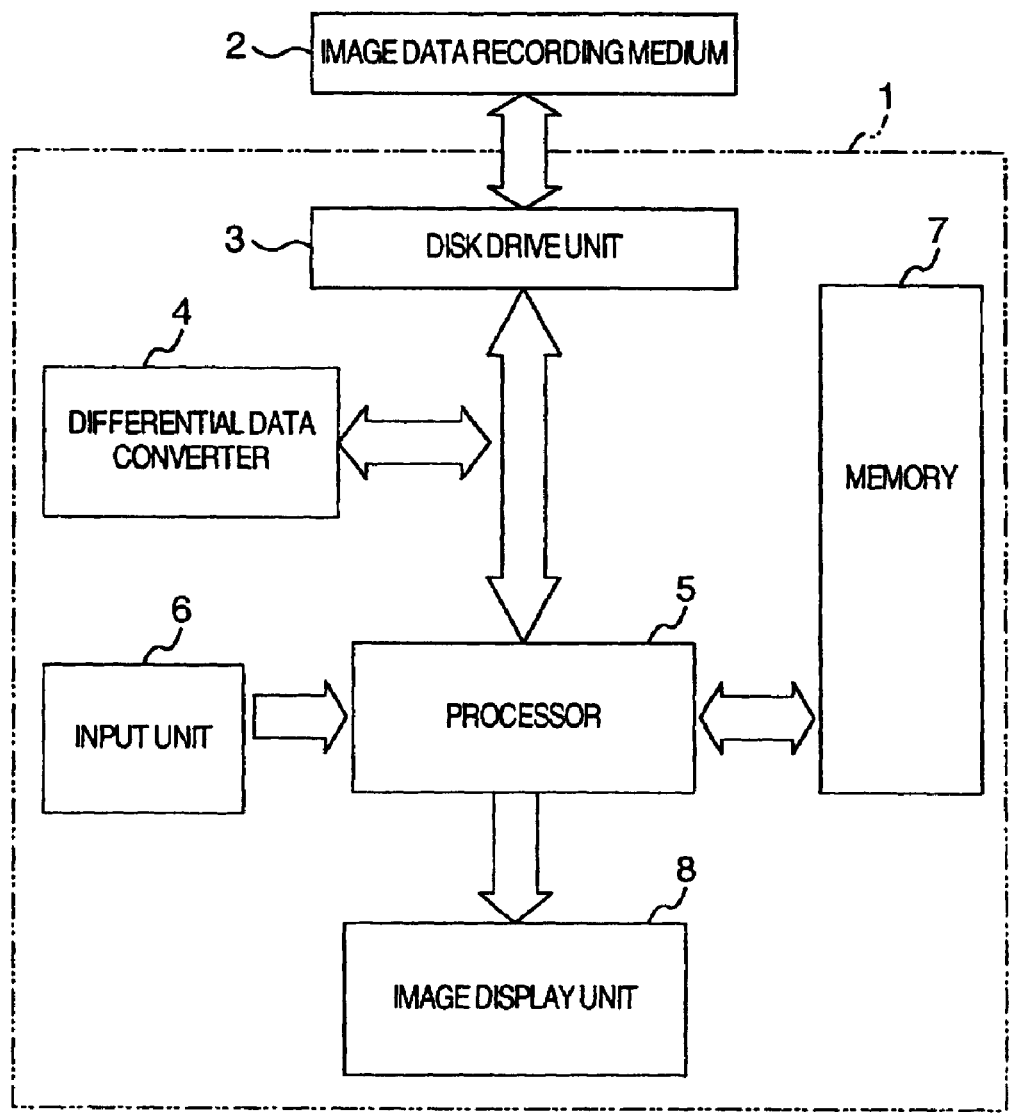
FIG. 4 is a block diagram showing an example of an image processing system using the cluster data in FIG. 1.

FIG. 4 is a block diagram of an image processing system utilizing a differential data structure according to the present invention. Image data to be image-processed and an image processing program as an application program are stored in a recording medium 2. The recording medium 2 is, for example, constituted by a floppy disk, a CD-ROM disk, an MO (Magneto-Optical) disk, a flash memory card, or the like. The image data or the image processing program is recorded in the recording medium 2 electrically, magnetically, optically, or through mechanical plastic deformation of a plastic material of the medium, or the like. The image data and the image processing program recorded in the recording medium 2 is made readable by an image processing system 1. The image processing system 1 is constituted by a computer such as a work station, a personal computer, or the like. The image data and the image processing program recorded in the recording medium 2 are read through a disk drive unit 3 corresponding to the recording medium 2 by the control of a processor 5. The read image data is supplied to a differential data converter 4. The differential data converter 4 has a function to convert the image data read from the recording medium 2 into a data structure easy for the processor 5 to carry out image processing. The image processing program read from the recording medium 2 is loaded into a memory 7 by the control of the processor 5, and executed by the processor 5. The processor 5 executes OS (Operating System) to carry out basic data processing. Further, the processor 5 executes the image processing program with reference to instructions from an input unit 6 such as a key board, a pointing device, or the like, so as to process the image data. The processed image data is displayed on an image display unit 8.

By use of the image processing system illustrated in FIG. 4, for example, image data to be subjected to 3D image processing is made of a set of vertexes in a space. Each of the vertexes has attribute data such as vertex normal line data (normal vector) indicating brightness, or the like, as well as a 3D coordinate value. Upon the coordinate value or the attribute data, the processor 5 carries out processing such as affine transformation, clipping, shading, perspective transformation, rendering, etc., in accordance with pipeline processing. Such a series of processing is occasionally called a graphic pipeline. Of such graphic pipeline processing, description will be made below about data processing concerned with affine transformation and perspective transformation using a differential data structure according to the present invention.

<<Integer Differential Data>>

Figure 1:
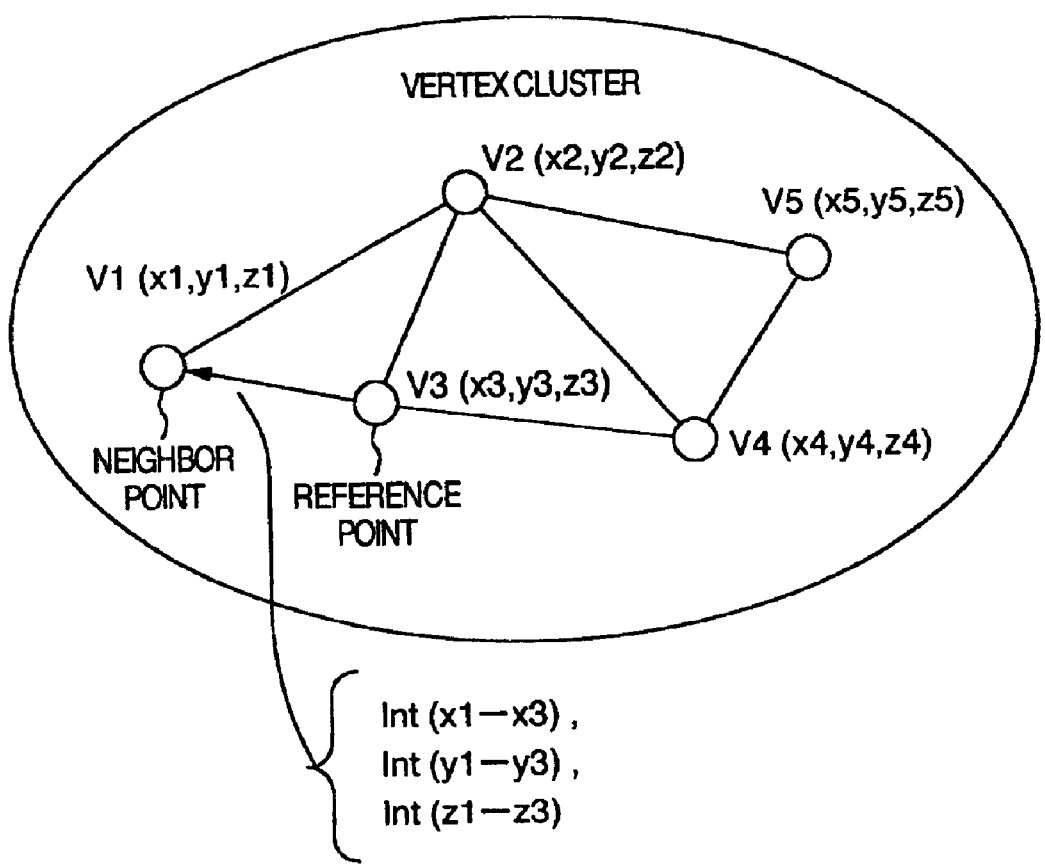
FIG. 1 is an explanatory view showing the meanings of a cluster as a vertex set forming a 3D image, and integer differential data.

FIG. 1 shows an example of a vertex set forming a 3D image. Here, an object surface in a 3D space is expressed by a set of triangles. Such triangles are called polygons. On the assumption that a polygon having three vertexes V1, V2 and V3 is described as a polygon V1V2V3, FIG. 1 shows an object surface having polygons V1V2V3, V2V3V4 and V3V4V5. Such geometric information can be expressed by providing a lineup of vertexes V1, V2, V3, V4 and V5 in this order. That is, except the first two vertexes V1 and V2, the polygon VlV2V3 can be matched off against the next vertex V3. Then, the polygon V2V3V4 is expressed by the next vertex V4 and the proceeding two vertexes V2 and V3 of the vertexes forming the proceeding polygon. Similarly, the polygon V3V4V5 is expressed by the next vertex VS. Data expression in which a new polygon is formed whenever a vertex is added in the above manner is called strip expression. The position of each vertex is defined by its 3D coordinate values, that is, an x-coordinate value, a y-coordinate value and a z-coordinate value. Assume that the respective coordinate values are expressed by floating point numbers. For example, assume that the x-coordinate value, the y-coordinate value and the z-coordinate value of the vertex V1 are expressed by x1, y1 and z1 respectively, and the respective coordinate values are floating point numbers. Each vertex has attribute data such as a color attribute, normal vector information, and so on, as well as the 3D coordinate values.

FIG. 1 shows a set of five vertexes V1, V2, V3, V4 and V5 by way of example. Such a predetermined set of vertexes is referred to as a cluster. The cluster is used to express a vertex set when the vertex set forming a complicated 3D object is divided into some simple subsets. An example of such a cluster includes a set of vertexes forming an object having a rigid characteristic, that is, a characteristic that the object does not change its shape when it moves in a space.

Figure 2A:
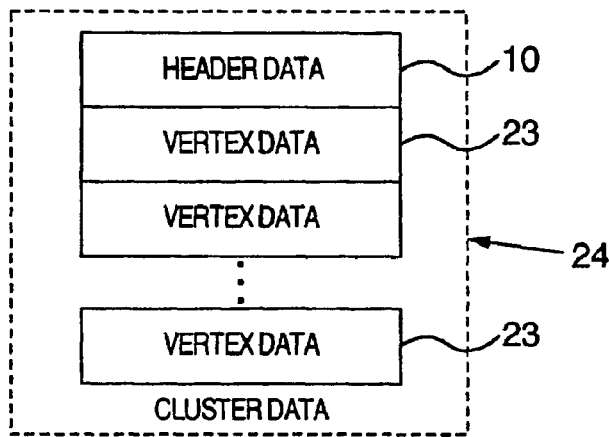

FIGS. 2A to 2D show a data structure of such cluster data by way of example. Cluster data 24 is constituted by header data 10 corresponding to the cluster, and vertex data 23 about vertexes contained in the cluster, as shown in FIG. 2A by way of example. The vertex data 23 exists for every vertex, and it is constituted by vertex coordinate data and necessary vertex attribute data (vertex normal line data, etc.).

Figure 2B:
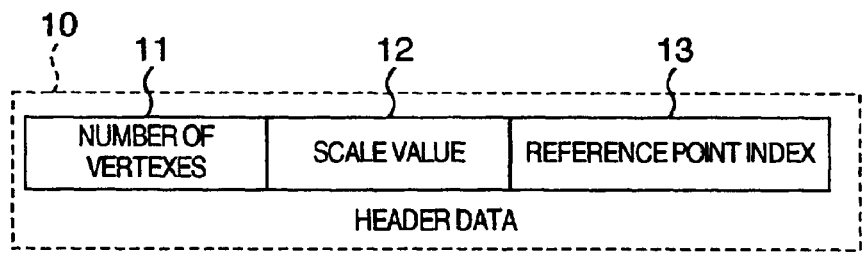

The header data 10 shown in FIG. 2B has a data structure defined for every predetermined vertex set (that is, cluster). The header data 10 is constituted by a vertex number field 11 which shows the number of vertexes forming the cluster, a scale field 12 which shows a scale value used for data conversion of differential data forming the cluster as will be described later, and a reference point index field 13 which indicates a reference point of the cluster. In addition, if necessary, the header data 10 may have a cluster attribute field showing attributes such as the optical reflection characteristic, the feel of a material, and so on, of the object expressed by the cluster.

Figure 2C:
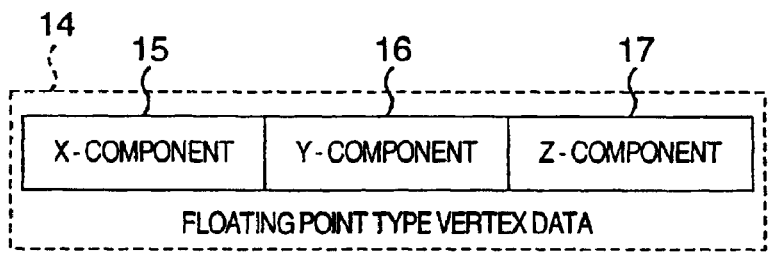
Figure 2D:
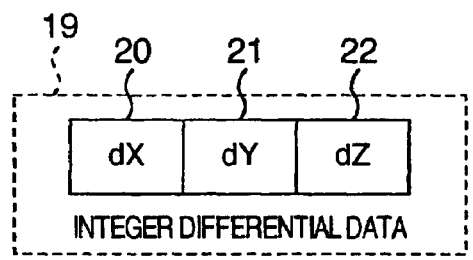

The vertex coordinate data included in the vertex data 23 is formed as floating point type vertex data 14 shown in FIG. 2C, or integer differential data 19 shown in FIG. 2D.

The floating point type vertex data 14 has a data structure in which vertex coordinates are expressed by floating point type data (also referred to as floating point number data). An x-component field 15, a y-component field 16 and a z-component field 17 of a vertex have x-, y- and z-components of coordinates of the vertex in four-byte floating point number expression respectively. For example, the floating point type vertex data 14 can express a point (reference point) as a reference for differential data expression which will be described later, or differential data converted into floating point type data.

The integer differential data 19 has an x-differential value field 20, a y-differential value field 21 and a z-differential value field 22. For example, the integer differential data 19 is data in which an x-component (dx), a y-component (dy) and a z-component (dz) are expressed, for example, by one-byte integer values respectively when the relative positional relationship between the vertex and the reference point is expressed by a differential vector between the reference point and the vertex.

In the example of cluster shown in FIG. 1, assume that the vertex V3 is a reference point of the cluster, and the vertexes V1, V2, V4 and V5 other than the reference point are referred to as neighbor vertexes. FIGS. 3A and 3B show an example of data of a cluster (cluster data) corresponding to the cluster in FIG. 1. In the integer differential expression shown in FIG. 3A, the x-, y- and z-coordinate values of the reference point V3 are expressed by the floating point data type, and those of the neighbor vertexes V1, V2, V4 and V5 are expressed by the integer differential data type. FIG. 3B shows the floating point differential expression of those neighbor vertexes. The data of each of the neighbor vertexes V1, V2, V4 and V5 shows values in which the x-, y- and z-components of a differential vector between the reference vertex and the neighbor vertex expressed by floating point data respectively have been converted into one-byte integers respectively. For example, the differential vector of the neighbor vertex V1 with respect to the reference point V3 is expressed by "(x1–x3, y1–y3, z1–z3)" as illustrated in FIG. 3B. In the integer differential data 19, the floating point values have been converted into integers as illustrated in FIG. 3A. The differential vector of the neighbor vertex V1 in the integer data type is described as "(Int(x1–x3), Int(y1–y3), Int(z1–z3))". FIG. 1 shows the relationship between the integer differential value "(Int(x1–x3), Int(y1–y3), Int(z1–z3))" and the vertex data by way of example. Here, the symbol "Int" means a value obtained by converting the floating point data type into the integer data type. The conversion method will be described in detail later.

By expressing the positional information of the neighbor vertexes as integer differential data compressed into the integer data type, the data size required for coordinate data expression of image data stored in the recording medium 2 can be reduced to about a quarter of that in the case where the coordinate data of all the coordinate points are expressed by the floating point data type.

<<Compression Method to Integer Differential Data>>

A method for producing or converting integer differential data of the differential data expression type, that is, a polygon data compression method is shown in the flow chart of FIG. 5 by way of example. This method is to make up respective vertex data 23 of cluster data 24 from a vertex set which has floating point type coordinate data V1 (x1, y1, z1) to V5 (x5, y5, z5) as shown in FIG. 1.

In Step S1, a vertex set to be clustered is selected. As described above, when a complicated 3D object is divided into simpler parts, clusters are used correspondingly to the respective parts. An example of such a cluster includes a set of vertexes forming an object having a rigid characteristic, that is, a characteristic that the object does not change its shape when it moves in a space. Such clusters are defined in a stage for modeling image data. Here, the coordinate values of vertexes contained in such clusters are read in. Assume that the respective coordinate values are expressed as floating point type data.

In Step S2, a vertex (reference point) which is a reference for integer differential expression is selected from a set of vertexes forming the selected cluster. The vertexes other than the reference point are called neighbor points. In order to prevent the differential vector length between the reference point and each neighbor point from varying largely at every neighbor point, a "barycentric point" of the set of vertexes contained in the cluster is obtained. For example, one vertex close to the coordinate values of the obtained barycentric point is set as the reference point. That is, here, the x-coordinate value of the barycentric point is set to be an average value of the x-coordinate values of the respective vertexes, that is, a value obtained by dividing the total sum of the x-coordinate values by the number of the vertexes. Similarly, the y- and z-coordinate values of the barycentric point are set to be average values of the y- and z-coordinate values of the vertexes respectively. The distance between the barycentric point and each vertex is calculated, and the vertex having the shortest distance from the barycentric point is set to be a reference point of this cluster. The vertexes other than the reference point are referred to as neighbor points.

In Step S3, a scale value for forming a differential vector between the reference point and each neighbor point in the integer type is calculated. Of the distances between the reference point and the respective neighbor points, the largest value is regarded as L. For example, a quotient obtained by dividing the value L by the value of 127 is set to be a scale value (floating point number) of the cluster, and regarded as S. Here, such a scale value is used to express a differential value by a 1-byte signed integer in a range of from 0 to 127. To change the bit size with which the integer value is expressed, it will go well if a positive integer value which can be expressed with that bit size is set as S. On this occasion, each component of the integer differential data 19 may be changed to that bit size.

In Step S4, an integer difference of each neighbor point from the scale value is calculated. First, a differential vector between each neighbor point and the reference point is expressed in the floating point type. For example, in accordance with the floating point differential expression in FIG. 3B, the differential vector of the neighbor point V1 from the reference point V3 is expressed by "(x1–x3, y1–y3, z1–z3)". Next, the x-, y- and z-components of this floating point type differential vector are divided by the scale value S calculated in Step 3, respectively. The quotients obtained thus are rounded off and converted into integer values respectively. When such an operation is expressed by the symbol "Int", the floating point type differential vector "(x1–x3, y1–y3, z1–z3)" in the above-mentioned example can be expressed approximately by the integer type differential vector "(Int (x1–x3), Int(y1–y3), Int(z1–z3)". Such an operation is carried out upon all the neighbor points. The x-, y- and z-components of the integer differential data 19 for the neighbor vertexes V1, V2, V4 and V5 are shown in the integer differential expression in FIG. 3A.

Because the method of conversion of a floating point number to an integer is known, the detailed description thereof is omitted here. For example, the conversion method can be achieved in the following processing. A mantissa M of a floating point number is transformed to M=1.b1b2b3 . . . bL so that the number of significant digits L of the mantissa M is matched to the number of digits of integer data. A value E0+L which is a sum of a power of number E0 of an exponent E and the number of significant digits L of the mantissa of the floating point number is obtained. If the relation E<E0+L is established, the mantissa M is shifted to right by one digit and the exponent E is increased by +1 till the relation E=E0+L is established. The value b1b2b3 . . . bL when E=E0+L is set to be an absolute integer value. If the sign of the floating point number is negative, the absolute value is converted into a complement of "2" (two). Thus, the conversion from the floating point number to the integer is completed.

In Step S5, the integer differential data 19 is constructed from the respective components of the integer differential data of the neighbor points obtained in Step 4. The header data 10 corresponding to this cluster, the floating point type vertex data 14 corresponding to the reference point, and the integer differential data 19 are combined to form cluster data 24.

In Step S6, it is judged whether there is an unprocessed cluster or not. If there is an unprocessed cluster, the cluster is processed similarly.

<<Expansion to Floating Point Differential Data>>

The differential data converter 4 has a function of converting the integer differential data 19 into floating point type data. The differential data converter 4 first converts the values dX, dY and dZ of the x-, y- and z-differential value fields 20, 21 and 22 of the inputted integer differential data 19 into a four-byte single-precision floating point type respectively.

Because the method of conversion of an integer to a floating point number is known, the detailed description thereof is omitted here. For example, the conversion method can be achieved in the following processing. The sign of integer data is set as the sign (S) of floating point number data, and binary expression (b0b1b2 . . . bL) of the absolute value of the integer data is obtained so that the number of digits (L+1) of the binary expression becomes equivalent to the number of digits of the mantissa. The binary expression of the absolute value is set as the mantissa (M=b0.b1b2 . . . bL) before normalization, and the exponent (E=E0+L) before normalization is determined from the number of digits (L) of the binary expression and the bias (E0) of the exponent. Thus, a floating point number which has not been normalized is obtained from the mantissa and the exponent. By normalizing this floating point number, the conversion of the integer data to the floating point number is completed.

Next, the respective differential values expressed by the floating point are multiplied by the scale number of the scale field 12. Thus, the integer data is converted into floating point type differential data. For example, the respective integer values shown in the integer differential expression in FIG. 3A are converted to 4-byte floating point values as shown in the floating point differential expression in FIG. 3B. That is, of the respective vertex data 23 forming the cluster data 10, those corresponding to the neighbor points are converted from the data structure of the integer differential data 19 into the floating point type differential data by the data conversion. Incidentally, the x-, y- and z-components here mean the x-, y- and z-components of a vector indicating the difference between the reference point and a neighbor point, respectively. In the following processing such as affine transformation, perspective transformation, and so on, operation is carried out upon the floating point differential data converted thus. The data size of the floating point type differential data for each vertex is expanded to 4 bytes for every component.

<<Affine Transformation>>

Figures 6A, 6B:
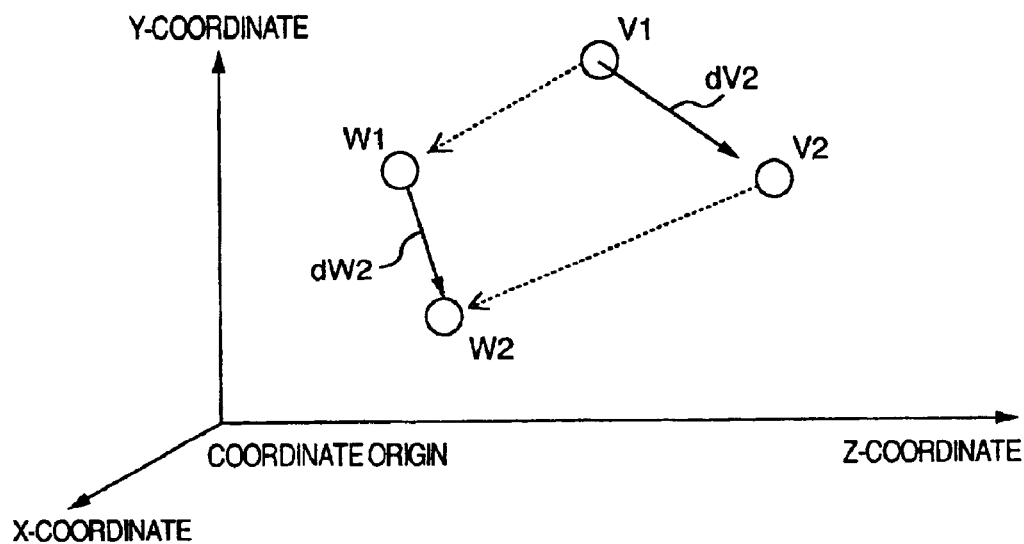
FIGS. 6A and 6B are explanatory views showing an affine transformation method using expanded floating point differential data by way of example.

FIGS. 6A and 6B show an example of affine transformation using the expanded differential data. In Expression 1 shown in FIG. 6B, assume that W, V and P designate vectors in a 3D space respectively, and M designates a 3×3 square matrix. The symbol * means a product. Then, the transformation of the vector V to the vector W is called affine transformation. The affine transformation is defined by using the matrix M and the vector P. The vector P is interpreted as parallel displacement in the 3D space. Expression 2 in FIG. 6B expresses the affine transformation of Expression 1 by components. In FIG. 6A, assume that points V1 and V2 are transformed to points W1 and W2 respectively by the affine transformation. In addition, assume that a vector dV2 is a relative vector from the point V1 to the point V2, and the x-, y- and z-components of the vector dV2 are expressed by dx2, dy2 and dz2 respectively. Further, assume that a vector dW2 is a relative vector from the point W1 to the point W2.

At this time, in view of mathematical linearity, the vector dW2 is merely a variant of the vector dW1 transformed by using the matrix M. That is, the influence of the parallel displacement included in the affine transformation does not appear in the relative vector. By use of this characteristic, the cluster data of vertexes shown by differential expression are operated.

Now, assume that the point V1 in FIG. 6A is a reference point of a vertex cluster, and the point V2 is a neighbor point of the cluster. Then, the floating point type differential data of the neighbor point V2 converted by the differential data converter 4 is shown by the coordinate differential expression before affine transformation in FIG. 7A.

On the assumption that the points W1 and W2 are obtained by applying the affine transformation shown by Expressions 1 and 2 in FIG. 6B to the reference point V1 and the neighbor point V2 in the cluster respectively, W1 designates a reference point in a transformed cluster and W2 designates a neighbor point in the transformed cluster. Then, the transformed cluster data are shown by the coordinate differential expression after the affine transformation in FIG. 7B. That is, from the characteristic that the influence of the parallel displacement included in the affine transformation does not appear in the relative vector, it is understood that it will go well if the vector of the neighbor point constituted by the x-, y- and z-components of the floating point type differential data is transformed simply by using the matrix M of Expressions 1 and 2 in FIG. 6B. Incidentally, not to say, the reference point V1 needs transformation by using the matrix M of Expressions 1 and 2 in FIG. 6B and parallel displacement with the vector P.

By applying such affine transformation to the cluster, the operation of parallel displacement is not required in the affine transformation for vertexes corresponding to neighbor points. Thus, such affine transformation can contribute to reduction in the operation quantity.

<<Perspective Transformation>>

Figures 8A, 8B:
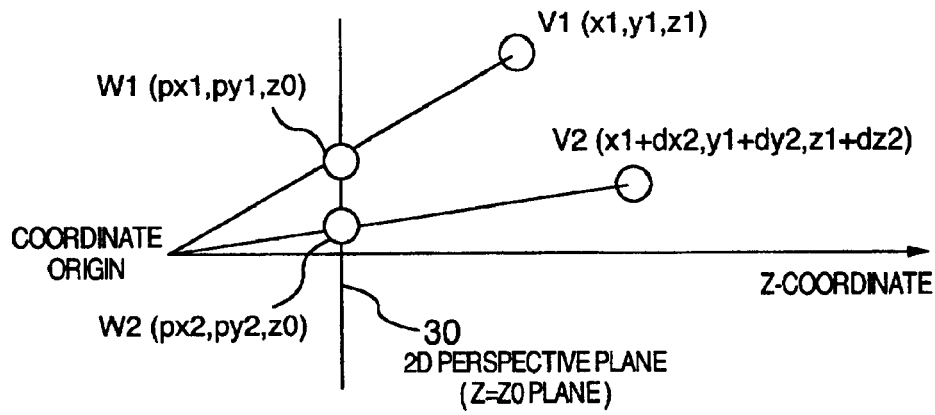
FIGS. 8A and 8B are explanatory views showing a perspective transformation method using expanded floating point differential data by way of example.

FIGS. 8A and 8B shows a method of perspective transformation using the expanded vertex differential data by way of example. FIG. 8A is a view of a 3D space from a direction perpendicular to the z-axis. An intersection point between a straight line connecting the point V1 and the origin and a two-dimensional (hereinafter referred to as "2D") perspective plane 30 is expressed as W1. Assume that obtaining the intersection point W1 between the straight line connecting the point V1 and the origin and the perspective plane 30 in the above manner is called perspective transformation, and W1 is referred to as a perspective point.

The x-, y- and z-coordinate values of the perspective point W1 are expressed by px1, py1 and z0 respectively. Since the coordinate values of any point on the 2D perspective plane satisfy the equation "z=z0", the z-coordinate value of any point on this plane is always z0. The x- and y-coordinate values px1 and py1 of the perspective point W1 can be calculated by Expressions 3 and 4 in FIG. 8B on the basis of the geometric relationship of similarity. Here, the value A included in Expressions 3 and 4 is calculated in accordance with Expression 1. That is, to calculate the coordinate values of a perspective point, one time of division and two times of multiplication are sufficient.

If the point V2 is close enough to the point V1, the x- and y-coordinate values of the perspective point W2 of the point V2 can be calculated in accordance with an approximate expression using no division. In this approximate expression, series (Expression 10 in FIG. 8B) obtained by "Maclaurin series expansion" of a differentiable function "1/z" in the mathematical field in the vicinity of z=z1 is aborted at the constant term and the primary term. In other words, Maclaurin series expansion aborted at the constant term and the primary term is applied to z0/(z1+dz2) as shown by Expression 11 in FIG. 8B. Thus, if the point V2 in FIG. 8A is close enough to the point V1, the x- and y-coordinate values of the perspective point W2 of the point V2 can be approximated by px2 and py2 in Expressions 5 and 6 in FIG. 8B, respectively. Here, the values dx2, dy2 and dz2 are x-, y- and z-components of a relative vector from the point V1 to the point V2 respectively. In addition, "x1+dx2", "y1+dy2" and "z1+dz2" are the x-, y- and z-coordinate values of the point V2 expressed by the coordinate values of the point V1 and the component values of the relative vector from the point V1 to the point V2, respectively.

Here, assume that the values A and B included in Expressions 5 and 6 in FIG. 8B are calculated in advance in accordance with Expressions 1 and 2 in FIG. 8B, and the values calculated once are reused for the value "A−B*dz2" in Expressions 5 and 6. On this assumption, for approximate calculation of the coordinate values of a perspective point, three times of multiplication and three times of addition are sufficient practically. That is, division every time is not necessary (here, the symbol "*" designates multiplication). When the number of operation cycles required for division by the processor is much larger than that of multiplication or addition, the total operation/processing time is shortened if approximate calculation as mentioned above is applied to points which is close enough to the point V1 and which is to be subjected to perspective transformation. For example, if it takes 15 cycles for one time of division of floating point data and it takes 2 cycles respectively for one time of multiplication and one time of addition of floating point data, it takes 23 cycles totally for one time of division, two times of multiplication and two times of addition when no approximate calculation is carried out. On the other hand, if approximate calculation is carried out, it takes only 12 cycles totally for three times of multiplication and three times of addition.

FIG. 9 shows a flow chart of perspective transformation processing using floating point differential data. Now, assume that the point V1 in FIG. 8A is a reference point of a cluster, and the point V2 is a neighbor point of the cluster.

In Step S11, a perspective point corresponding to the reference point is first calculated in accordance with normal perspective transformation including division. That is, the coordinate values of the perspective point are calculated in accordance with Expressions 1, 3 and 4 in FIG. 8B. In addition, values reused repeatedly in the following approximate calculation are calculated in accordance with Expression 2 in advance.

In Step S12, judgment is made as to whether approximate calculation which does not include division can be applied to a neighbor point contained in this cluster. If the z-coordinate value of the reference point V1 is too close to the coordinate origin, an error caused by approximation is enlarged. Therefore, when the z-coordinate value of the reference point V1 is smaller than a value c predetermined by the image processing program, the processing proceeds to Step S13 in order to avoid such a conspicuous error. If the z-coordinate value is not smaller, the processing proceeds to Step S14.

In Step S13, the x- and y-coordinate values of the perspective point corresponding to the neighbor point are calculated in accordance with Expressions 7, 8 and 9 in FIG. 8B. The values dx, dy and dz are x-, y- and z-component values of floating point type vertex data corresponding to the neighbor point respectively.

In Step S14, a value "A−B*dz2" shared in the approximation of the x- and y-coordinate values of the perspective point corresponding to the neighbor point is calculated. Here, A and B designate values calculated in Step S11 in accordance with Expressions 1 and 2 in FIG. 8B, and dz2 designates the z-component value of the floating point type vertex data corresponding to the neighbor point.

In Step S15, approximation of the x-coordinate value of the perspective point corresponding to the neighbor point is calculated in accordance with Expression 5 in FIG. 8B. The value dx2 is an x-component value of the floating point type vertex data corresponding to the neighbor point.

In Step S16, approximation of the y-coordinate value of the perspective point corresponding to the neighbor point is calculated in accordance with Expression 6 in FIG. 8B. The value dy2 is a y-component value of the floating point type vertex data corresponding to the neighbor point.

If there is an unprocessed neighbor point in the given cluster in Step S17, the processing proceeds to Step S15. If there is no unprocessed neighbor point, the perspective transformation of points contained in the cluster is terminated.

Though not limited specifically, the processing program with which the processor 5 carries out the aforementioned "affine transformation" and "perspective transformation" is included in the image processing program read from the recording medium 2.

Here, description will be made about the operation/effect obtained by compression of image information with the adoption of the aforementioned integer differential data structure, expansion of the compressed image information, and "affine transformation" and "perspective transformation" using floating point differential data obtained by the expansion, as described above, respectively. Generally, in polygon expression of a 3D image, it is considered that the more the number of polygons, the smoother and finer the constructed 3D image. On the contrary, increase in the number of polygons results in increasing the number of vertexes and the required data quantity, and hence increasing the calculation quantity required for image processing.

In a model in which positional information of any vertex forming polygons is expressed by 4-byte floating point data for every component of the coordinates, if the positional information is converted into the integer differential data 19 compressed into the integer data type as described above, it is possible to compress the data size required for the positional information of the polygons into about a quarter when the image data is stored.

In addition, in the expansion processing, 1-byte integer data for every vertex is data-type-converted into 4-byte floating point data, and the converted data is multiplied by the scale value (data in the field 12). Thus, complicated expansion processing is not required.

In addition, by use of the characteristic that the respective x-, y- and z-components of any neighbor point are relative values with respect to the reference point when the integer differential data 19 is expanded to floating point type vertex data, operation for parallel displacement may be unnecessary in affine transformation. Thus, this characteristic can contribute to reduction in operation quantity.

Further, the increase of the number of vertexes means that the distance between one vertex and another vertex becomes shorter. Thus, division can be approximated by the combination of multiplication and addition in the perspective transformation processing. In addition, the shorter distance between the reference point and each neighbor point results in a smaller error. Thus, in a processor in which the number of cycles required for division is large, it is possible to shorten the total time of the perspective transformation processing without lowering the quality of the image.

<<Another Example of Integer Differential Data>>

Figures 10A, 10B:
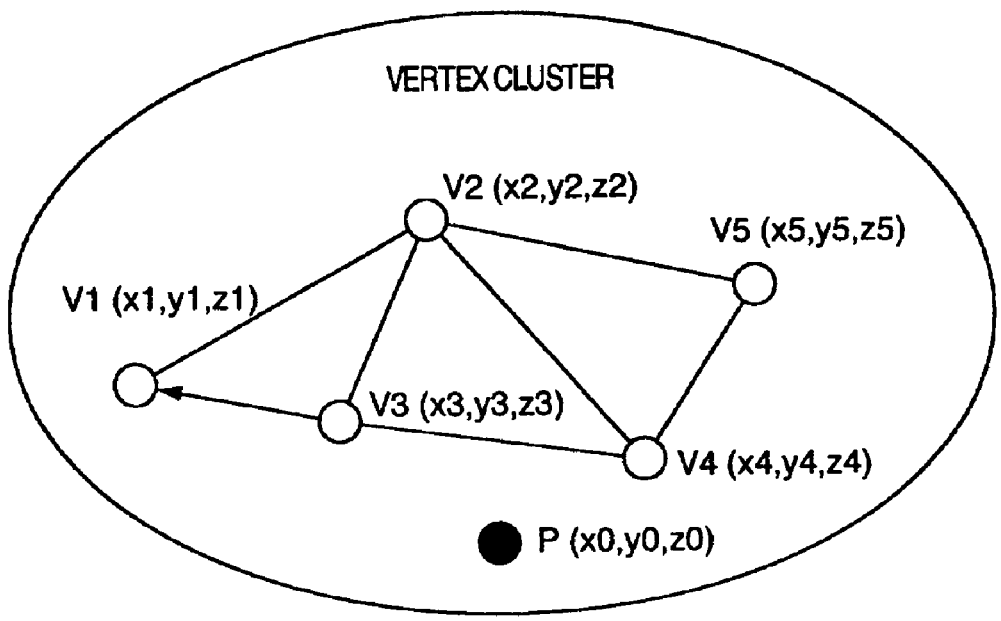
FIGS. 10A and 10B are explanatory views showing an example of the case where integer differential data is produced by use of a barycentric point of a vertex set of a cluster as a reference point.

In the above description, one vertex is selected, as a reference point of a cluster, from vertexes forming polygons as described with reference to the flow chart of FIG. 5. That is, in Step S2, a "barycentric point" of a vertex set contained in the cluster is obtained, and a vertex close to the coordinate values of the barycentric point is set as a reference point. Then, the barycentric point itself may be set as the reference point. That is, when a point P is a barycentric point of a cluster constituted by points V1, V2, V3, V4 and V5 as shown in FIG. 10A, all the vertexes V1, V2, V3, V4 and V5 constituting the cluster are set as neighbor points, and the contents of integer differential data 19 thereof can be expressed by integer differential expression in FIG. 10B. Here, it is assumed that x0, y0 and z0 are x-, y- and z-coordinate values of the barycentric point of the cluster respectively, and "Int" has a meaning similar to that in the above description.

The cluster data 24 obtained thus is different from that in the above-mentioned example as follows. That is, the reference point index field 13 for indicating a vertex as a reference point becomes unnecessary in the header data 10.

It will go well if the positional information of the reference point P is expressed in the form of the floating point type vertex data 14 and disposed immediately after the header data as the data structure. Here, since the reference point P is not a vertex forming any polygon, additional attribute data such as vertex normal line data or the like is not required for the reference point P. Then, vertex data 23 corresponding to the respective vertexes are disposed immediately after the data corresponding to the reference point P sequentially as the data structure. For example, this sequence may follow the vertex order defined by the strip expression.

Also in affine transformation, the relationship between the reference point P and each neighbor point is substantially similar to that in the aforementioned example, except that all the vertexes forming the cluster play the roles of neighbor points and the reference point P is not a vertex of any polygon. Also in perspective transformation, the relationship between the reference point P and each neighbor point is substantially similar to that in the aforementioned example, except that all the vertexes forming the cluster play the roles of neighbor points and the reference point P is not a target of display on a real perspective plane.

Also in the case where the reference point is set thus, the positional information of each vertex in the cluster is converted into integer differential data compressed to the integer data type in the same manner as in the above-mentioned example. In such a manner, it is possible to compress the data size required for the positional information of the polygons to about a quarter when the image data is stored.

In addition, in the processing for compressing the image data into the integer differential data, it is not necessary to select a reference point from the vertexes forming the cluster. It is therefore possible to make the compression time shorter than that in the aforementioned example. Further, the positional information of reference point is always located in the same place (for example, immediately after the header data 10) in the cluster data 24, and all the vertex data have the same differential data structure. It is therefore possible for the processor or the like to gain access to data regularly when the image processing program is executed. Also from this point of view, it is possible to facilitate shortening of the processing time.

In addition, in the same manner as that in the aforementioned example, the operation of parallel displacement may be unnecessary in the affine transformation. Accordingly, it is possible to contribute to reduction in operation quantity. Further, in the same manner as that in the aforementioned example, division can be approximated by the combination of multiplication and addition in the perspective transformation processing. A shorten distance between the reference point and any neighbor point results in a smaller error. Therefore, in a processor or the like required to have a large number of cycles for division, it is possible to reduce the total processing time without lowering the quality of the image.

<<Another Conversion Example to Floating Point Differential Data>>

In the aforementioned example, the integer differential data 19 is converted into floating point type differential data by the differential data converter 4 which is hardware serving as an accelerator for the processor 5, or the like. However, as another implementation system, such a conversion function may be given to a predetermined data load instruction which is executed by the processor 5 without using the differential data converter 4.

For example, the differential data converter 4 is omitted in FIG. 4. Assume that the respective cluster data 24 are once stored from the image data recording medium 2 into the memory 7. Although this store processing may be carried out by the processor 5, it may be carried out by a not-shown DMAC (Direct Memory Access Controller). The processor 5 can operate according to the image processing program in response to a predetermined data load instruction (FLOAD instruction) having a function of loading positional data of a vertex into registers in the processor 5 and a function of converting the format of integer data into the floating point type. That is, in response to the FLOAD instruction, the processor 5 can convert the x-, y- and z-differential value fields 20, 21 and 22 of the integer differential data 19 in the memory into the floating point number types respectively and load them into floating point registers. The following affine transformation or perspective transformation can be carried out according to the image processing program in the same manner as that in the aforementioned example. Thus, the same effect as that in the aforementioned example can be obtained. In addition, when such a conversion function is given to the FLOAD instruction executed by the processor 5 without using the differential data converter 4, a data expansion function can be flexibly matched, by changing the program, to the case where the data compression type of the image data is changed to some degrees.

Figure 11:
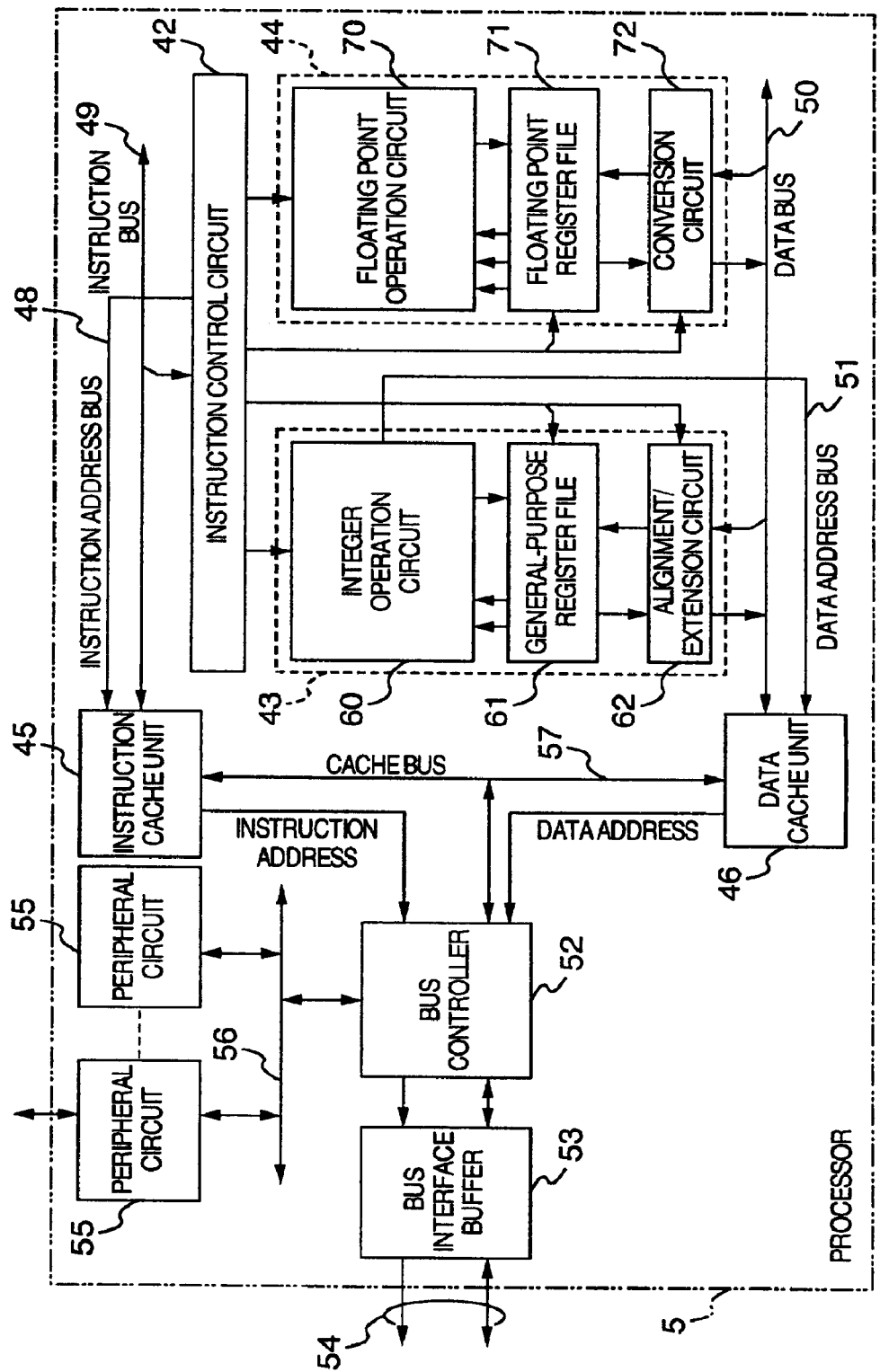
FIG. 11 is a block diagram showing an example of a processor supporting an FLOAD instruction.

FIG. 11 shows an example of a processor supporting the FLOAD instruction. Though not limited specifically, the processor 5 shown in FIG. 11 has a 32-bit RISC (Reduced Instruction Set Computer) architecture, and the instruction set thereof includes 16-bit fixed-length floating point instructions. The example described here is effective in equipment built-in control application required to support 3D graphics, such as application to a game machine or the like.

The processor 5 has an instruction control circuit 42, an integer unit 43, a floating point unit 44, an instruction cache unit 45, and a data cache unit 46.

The instruction control circuit 42 is connected to the instruction cache unit 45 through an instruction address bus 48 and an instruction bus 49. On the other hand, the integer unit 43 and the floating point unit 44 are connected to the data cache unit 46 through a data bus 50. Addressing for data access through the data bus 50 is carried out exclusively by the integer unit 43. An address bus 51 is connected from the integer unit 43 to the data cache unit 46.

The instruction control circuit 42 fetches an instruction from the instruction cache unit 45 according to the execution sequence of the program, decodes the instruction and produces a control signal so as to control the operations of the integer unit 43, the floating point unit 44, and so on. The execution sequence of the program is decided on the basis of the value of a not-shown program counter or an interruption request. An instruction address is given to the instruction cache unit 45 through the instruction address bus 48. An instruction in the instruction address is given from the instruction cache unit 45 to the instruction control circuit 42 through the instruction bus 49.

The integer unit 43 has an integer operation circuit 60, a general-purpose register file 61, and an alignment/extension circuit 62. The integer operation circuit 60 has an arithmetic logic operation element, an arithmetic operation element, a shifter, etc. so as to make it possible to carry out arithmetic operation, logic operation, and address operation of the integer data. Though not limited specifically, the general-purpose register file 61 has a plurality of 32-bit-length general-purpose registers. The general-purpose register file 61 is used as a byte (8 bits), word (16 bits) or long-word (32 bits) data register and address register. Though not limited specifically, the data bus 50 has a width of 64 bits. The alignment/extension circuit 62 has an aligner function of matching bit positions between data transmitted through the 64-bit-width data bus and the general-purpose registers in accordance with the data size or the like, and an extension function of sign extension or logical value "0" extension of data.

Incidentally, the circuitry merging all or parts of the integer unit 43 and the instruction control circuit 42 may be positioned as a so-called CPU.

The floating point unit 44 has a floating point operation circuit 70, a floating point register file 71, and a conversion circuit 72. The floating point operation circuit 70 has a multiplier, an adder, a normalizer, etc. so as to make it possible to carry out sum-of-product operation of floating point number data. The floating point register file 71 has a plurality of 32-bit floating point registers. The floating point registers are used as source data registers, destination data registers, and so on, in floating point operation. The floating point registers are connected to the data bus 50 through the conversion circuit 72. Each of the floating point registers has a width of 32 bits so that one floating point register is used for every single-precision floating point number data. Two floating point registers are assigned in pair to double-precision floating point number data.

The conversion circuit 72 has an aligner function of matching bit positions between data transmitted through the 64-bit-width data bus 50 and the floating point registers in accordance with the data size or the like, an extension function of sign extension or logical value "0" extension of integer data, a type conversion function of converting integer data into floating point number data, and a type inversion function for carrying out inversion. The details of those functions will be described later.

Each of the data cache unit 46 and the instruction cache unit 45 has a not-shown cache controller and a not-shown cache memory. The instruction cache unit 45 and the data cache unit 46 are connected to a bus controller 52 through a cache bus 57 including data signals and control signals. An instruction address for external access caused by cache mishit or the like in the instruction cache unit 45 is given to the bus controller 52. In addition, a data address for external access caused by cache mishit or the like in the data cache unit 46 is given to the bus controller 52. In accordance with the instruction address or the data address, the bus controller 52 controls the start-up of an external bus cycle so as to gain access to an external memory (not shown) or the like connected to a bus interface buffer 53 through an external bus 54. In addition, peripheral circuits 55 such as a timer, a serial communication interface controller, and so on, are connected to the bus controller 52 through a peripheral bus 56. The processor 5 shown in FIG. 1 is formed into a single semiconductor substrate (a semiconductor chip) such as single-crystal silicon.

The instruction set of the processor 5 are roughly classified into a fixed floating point transfer instruction, an arithmetic operation instruction, a logic operation instruction, a branch instruction, a system control instruction, a floating point instruction, etc. As described above, all the addressing functions for data access and instruction fetch are allocated to the integer unit 43. Accordingly, when a decoded instruction is a floating point instruction (which is an instruction required to operate the floating point unit), the instruction control circuit 42 controls the addressing operation of the integer unit 43 for gaining access to source or destination data while giving an instruction for operation control or the like to the floating point unit 44.

Figure 12:
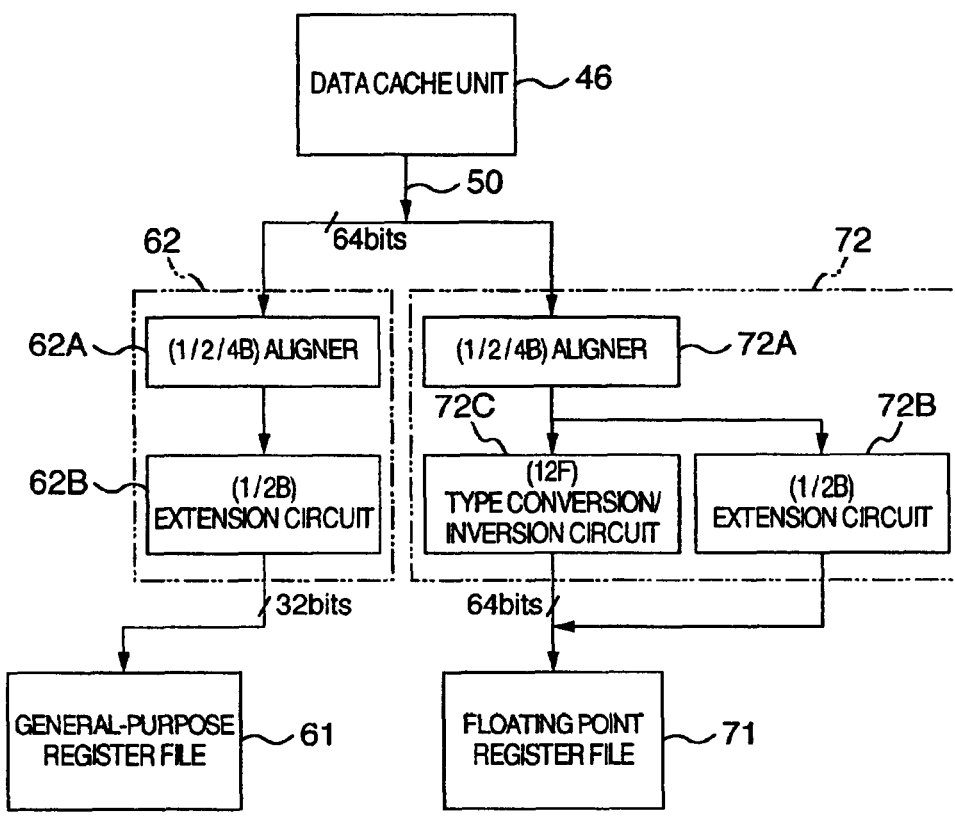
FIG. 12 is a block diagram showing a converter circuit and an alignment/extension circuit provided for the processor in FIG. 11 by way of example.

FIG. 12 shows an example of the conversion circuit 72 and the alignment/extension circuit 62. A data input/output port of the data cache unit 46 has a width of 64 bits, and 64-bit data appears on the bus 50 in data access. The alignment/extension circuit 62 includes an aligner 62A and an extension circuit 62B. The conversion circuit 72 has an aligner 72A, a type conversion/inversion circuit 72C, and an extension circuit 72B. FIG. 12 shows the circuit connection conditions on the assumption that data is loaded from the data cache unit 46 to the general-purpose register file 61 and the floating point register file 71. The connection conditions in the data transfer direction for storing the value of the floating point register file 71 into the data cache unit 46 are not shown.

When data is loaded into the general-purpose register file 61, the aligner 62A shifts 1-byte, 2-byte or 4-byte data of 64-bit data, which are supplied from the data bus 50, to the corresponding least significant bit field of 32-bit output. The extension circuit 62B receiving the 32 bits from the aligner 62A zero-extends (logic-value-"0"-extends) or sign-extends the least significant one or two bytes of the input 32 bits to 32 bits.

When data is stored from the general-purpose register file 61 to the data cache memory 46, though not shown specifically in FIG. 12, the aligner 62A receives the outputs of the general registers, and shifts one, two or four bytes of the 32-bit data, which are supplied from the general-purpose register file 61, to the corresponding least significant bit field of 64-bit output. At this time, the extension circuit 62B receiving the 64 bits from the aligner 62A zero-extends or sign-extends one, two or four bytes of the input 64 bits. Thus, the extension circuit 62B outputs the zero-extended or sign-extended data to the data bus 50.

When data is loaded from the data cache memory 46 to the floating point register file 71, the aligner 72A shifts one, two or four bytes of 64 bits, which are supplied from the data bus 50, to the corresponding least significant bit field of higher 32 bits or lower 32 bits of 64-bit output. At this time, the type conversion/inversion circuit 72C receiving the 64 bits from the aligner 72A is allowed to convert, in parallel, the higher and lower two integer data of the least significant one or two bytes of the higher 32 bits and the lower 32 bits of the input 64 bits into single-precision floating point number data, respectively. The extension circuit 72B is operated in place of the operation of the type conversion/inversion circuit 72C. That is, the extension circuit 72B zero-extends (logic-value-"0"-extends) or sign-extends the higher side of the least significant one or two bytes of the higher 32-bit integer data and the lower 32-bit integer data of the input 64 bits. Thus, the extension circuit 72B transfers the integer data to the floating point register file 71 as they are.

When data is stored from the floating point register file 71 to the data cache memory 46, though not shown especially in FIG. 12, the type conversion/inversion circuit 72C converts higher 32-bit floating point number data and lower 32-bit floating point number data of input 64 bits into one-byte or two-byte integer data respectively. Alternatively, the type conversion/inversion circuit 72C converts double-precision floating point number data of input 64 bits into 32-bit integer data. The converted integer data is supplied to the aligner as 64-bit data, disposed on the lower side of the bit fields corresponding to the upper 32 bits and the lower 32 bits respectively, and outputted to the data cache unit 46.

The operations of the conversion circuit 72 and the alignment/extension circuit 62 are controlled in accordance with the instruction decoding result of the instruction control circuit 42.

Figure 13:
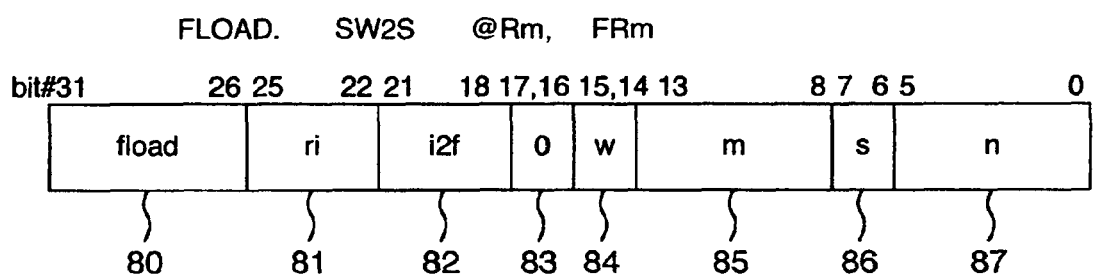
FIG. 13 is an explanatory view showing an instruction format of the FLOAD instruction by way of example.

FIG. 13 shows "FLOAD. SW2S @Rm, FRn" as a floating point load instruction of the processor 5 by way of example. The floating point load instruction shown in FIG. 13 is an instruction to give two-byte integer data from the cache memory of the data cache unit 46 to the conversion circuit 72, to convert the integer data into single-precision floating point number data in the conversion circuit 72, and to load the single-precision floating point number data into the single-precision floating point registers.

The floating point load instruction "FLOAD. SW2S @Rm, FRn" shown in FIG. 13 by way of example is constituted by a main operation code field 80', an addressing mode field 81, a sub-operation code field 82, a reserve field 83, a source operand size field 84, a base register assignment field 85, a destination register size assignment field 86, and a destination register assignment field 87.

In the example of FIG. 13, a main operation code "fload" indicating floating point load is allocated to the main operation code field 80; an addressing mode "ri" indicating register indirect addressing is allocated to the addressing mode field 81; a sub-operation code "i2f" indicating type-conversion of signed integer to single-precision floating point number is allocated to the sub-operation code field 82; a logical value "0" is allocated to the reserve field 83 as a zero field; a size "w" indicating two bytes (word) is allocated to the source operand size assignment field 84; a base register number "m" indicating the number of a general-purpose register as a base register is allocated to the base register assignment field 85; a size "s" of a floating point register as a destination register is allocated to the destination register size assignment field 86; and a destination register number "n" is allocated to the destination register assignment field 87.

Incidentally, here, the size of the source operand is set to be 2 bytes. It should be understood that the higher side of integer differential data every vertex component of which is compressed to one byte is "0"-extended to be aligned as two bytes for convenience of explanation.

Figure 14:
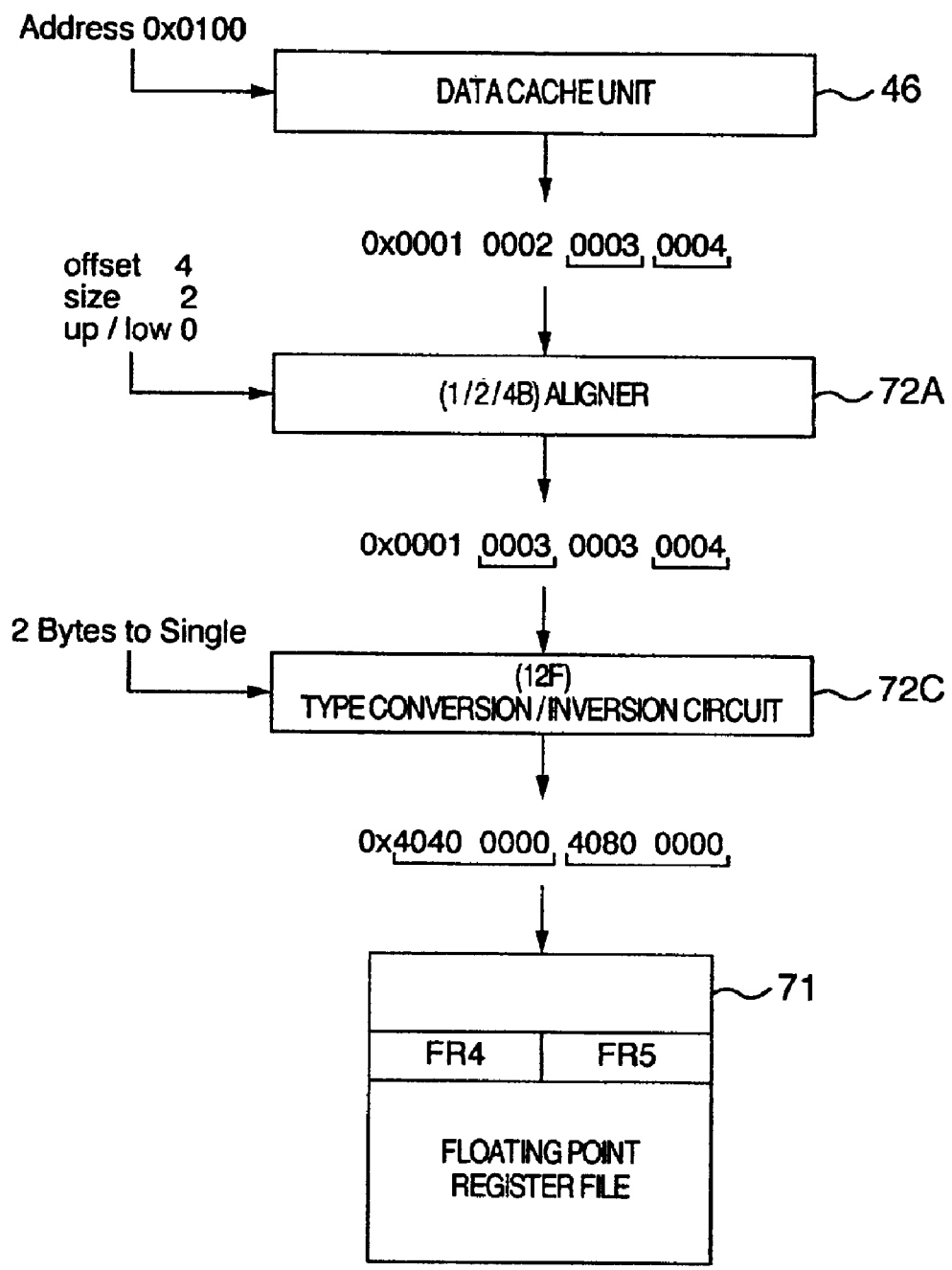
FIG. 14 is an explanatory view showing a data flow when the FLOAD instruction is executed, by way of example.

FIG. 14 shows a data flow when the floating point load instruction "FLOAD. SW2S @R1, FR4" is executed, by way of example. In FIG. 14, the instruction "FLOAD. SW2S @R1, FR4" to load two-byte integer data 0x0003 (0x designates a hexadecimal digit) stored in the address 0x0104 into a floating point register NO.4 (FR4) is shown by way of example.

Assume that the contents of a general-purpose register NO. 1 (R1) are the address 0x0104 of the source operand. Two-byte integers 0x0001, 0x0002 and 0x0004 are stored in the addresses 0x0100, 0x0102 and 0x0106 respectively.

As a first step, first, when the floating point load instruction "FLOAD. SW2S @R1, FR4" is issued, the data cache unit 46 is accessed by use of the contents 0x0104 of the general-purpose register R1 as an address. Then, 8-byte (64-bit) integer data 0x0001 0002 0003 0004 are read out from the address 0x0100 obtained by setting the least significant 4-bits of 0x0104 to be zero.

As a second step, for controlling the alignment of 8-byte data read from the data cache unit 46, the aligner 72A receives a control signal. That is, in the control signal, the value (32 bits) of the least significant bit 4 of the address 0x0104 is set as offset (offset 4) for 8 bytes of the input data; the access size 2 (16 bits) assigned by the instruction is set as size (size 2); and the value 0 of the least significant bit of the register NO.4 of the destination register (FR4) is set as up/low (up/low 0) as an output position assignment bit indicating whether the input data is shifted toward the higher or lower 32 bits of the output 64 bits. Thus, the lower 2 bytes 0x0003 of the offset 4 bytes (32 bits) of 8 bytes of the input data are shifted by two bytes from the offset 4 of 8 bytes of the output data toward the higher side. As for the other output values, the input values in the bit positions corresponding thereto are outputted as they are. Thus, the 8-byte data sequence 0x0001 0003 0003 0004 is outputted from the aligner 72A.

As a third step, the data conversion/inversion circuit 72C receives a control signal from the instruction control circuit 42. The control signal indicates converting 8 bytes of the output of the aligner 72A and signed 2-byte integer as a conversion method into 32-bit single-precision floating point numbers. Then, the data conversion/inversion circuit 72C forms two signed 2-byte integers from two 2-bytes 0x0003 and 0x0004 based on the respective least significant bits of the higher 4 bytes and the lower 4 bytes of the input 8 bytes. Then, the data conversion/inversion circuit 72C converts the respective signed 2-byte integers into 32-bit single-precision floating point numbers 0x4040 0000 and 0x4080 0000, and outputs 8 bytes of the two 32-bit single-precision floating point numbers.

As a fourth step, lastly, the higher 4 bytes 0x4040 0000 in the 8 bytes outputted by the type conversion/inversion circuit 72C are written into the single-precision floating point register NO.4 (FR4) in the floating point register file.

In the aforementioned procedure, the two-byte integer 0x0003 in the address 0x0104 is converted into the 32-bit single-precision floating point number data 0x40400000 (3.0), and written into the floating point register FR4.

The data loaded into the floating point register FR4 is multiplied by the scale value so as to be formed into floating point differential data. The floating point differential data is used for image processing such as affine transformation or the like.

A known method may be adopted as the method for converting integer data into floating point number data in the third step. It will go well if the known method is reflected in the conversion algorithm or conversion logic of the type conversion/inversion circuit.

The FLOAD instruction has a bit-length information field 84 indicating the bit length of integer data. Bit-length extension processing is carried out in accordance with a difference between the bit length of integer data and the bit length of the mantissa of a predetermined floating point format in the type conversion from integer to floating point. Bit-length information of integer data required for the bit-length extension processing can be obtained from the decoding result of the bit-length information field 84 of the FLOAD instruction. Thus, even if integer data different in bit length are mixed, it is possible to carry out processing with the aforementioned type conversion by one instruction. In comparison with the case where bit-length information of integer data to be processed is assigned by a control register, it is not necessary to carry out an extra register access operation whenever there is a change in the bit length of the integer data to be processed. Thus, the data processing efficiency is improved.

<<Information Processing Network>>

Figure 15:
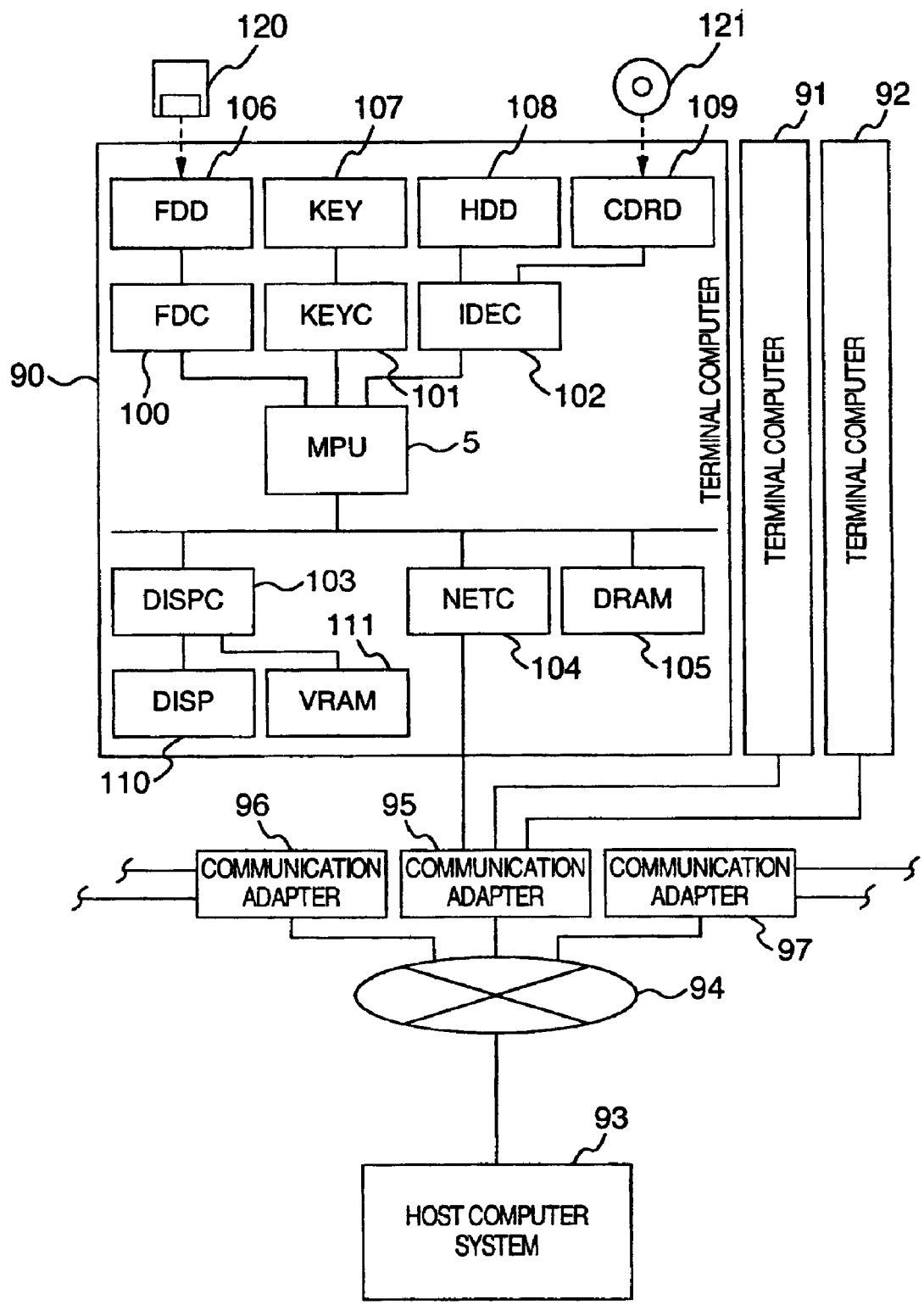
FIG. 15 is a block diagram showing an example of an information processing network.

FIG. 15 shows an example of an information processing network including an information processing apparatus (also referred to as a computer system) adopting the processor (MPU) 5 in FIG. 11.

The information processing network shown in FIG. 15 is a system such as a LAN (Local Area Network), a WAN (Wide Area Network) such as Internet or the like, a radio communication network, or the like. The reference numeral 94 represents a transfer medium such as an optical fiber, an ISDN line, a radio line, or the like, in the system. Though not limited specifically, terminal computer systems 90, 91 and 92 shown representatively are connected to the transfer medium 94 through a host computer system 93 and communication adapters 95, 96 and 97 such as routers, terminal adapters, or the like, respectively.

Though not limited specifically, the terminal computer system 90 has the processor (MPU) 5. A display controller (DISPC) 103, a network controller (NETC) 104, and a main memory (DRAM) 105 in the terminal computer system 90 are connected to the processor 5. In addition, the terminal computer system 90 is provided with a floppy disk controller (FDC) 100, a keyboard controller (KEYC) 101 and an integrated device electronics controller (IDEC) 102 which are connected to the peripheral circuit 55 of the processor 5. The DISPC 103 carries out drawing control on a video RAM (VRAM) 111, and carries out display control of the drawn display data on a display (DISP) 110. The NETC 104 is connected to the communication adapter 95 so as to carry out buffering, communication protocol control, and so on of transmission/reception information. The DRAM 105 is used as a program area, a work area, and so on, for the processor 1. A floppy disk drive unit 106 is connected to the FDC 100 so as to read/write information from/into a floppy disk 120 which is an example of the recording medium 2. A keyboard 107 is connected to the KEYC 101. A hard disk drive unit (HDD) 108 and a CD-ROM drive unit (CDRD) 109 are connected to the IDEC 102. The HDD 108 has a magnetic disk which is another example of the recording medium 2. The CDRD 109 has a CD-ROM 121 which is a further example of the recording medium 2. Incidentally, the other terminal computer systems 91 and 92 are configured similarly.

For example, when the terminal computer system 90 is used to expand image data specified by the cluster data 24 and carry out 3D graphics processing such as affine transformation, perspective transformation, or the like, upon the expanded image data, a program for the expansion and the 3D graphics processing is installed, for example, from the floppy disk 120 or the CD-ROM 121 into the hard disk drive unit 108. At this time, the image processing program for expansion, affine transformation, perspective transformation, and so on, is recorded in the floppy disk 120 or the CD-ROM 121 in advance. A set maker of the terminal computer system may provide the user with such a program preinstalled into the hard disk drive unit.

When executing the installed programs, the processor 5 loads the program into the DRAM 105 and fetches instructions from the DRAM 105 sequentially so as to execute the instructions. Incidentally, a part of the program stored in the CD-ROM 121 may be picked out and executed directly from the CD-ROM.

Thus, the terminal computer system 90 can install the program through the floppy disk 120 or the like, and execute the program directly from the hard disk drive unit 108 or the like.

In addition, the terminal computer system 90 can download the program from the host computer system 93. That is, for example, the host computer system 93 retains the compressed program in a hard disk unit or the like. After the terminal computer system 90 has established communication with the host computer system 93, the terminal computer system 90 specifies the program and issues an instruction to download the program. As a result, the program is transmitted to the transfer medium 94, and downloaded into the hard disk drive unit 108 of the terminal computer system 90. The downloaded program is thereafter expanded, and installed in a predetermined program storage area. Thus, the terminal computer system 90 is implemented with a function of carrying out 3D graphics processing such as affine transformation, perspective transformation, and so on.

The cluster data can be also incorporated into the computer systems 90, 91 and 92 through the recording medium 2 such as the CD-ROM disk 121 or the like, or the transfer medium 94.

When a data processing program for expanding the cluster data compressed into integer differential data and carrying out affine transformation and perspective transformation upon the expanded floating point differential data is recorded and provided in the recording medium 2, the processing of the affine transformation and the perspective transformation using such cluster data can be carried out easily.

In addition, if the cluster data including the integer differential data described in FIG. 1 is recorded and provided in the recording medium 2 (120, 121), image processing is carried out with the data. Thus, the expansion of the compressed data does not impose a heavy burden on the processor processing performance, and the cost of the recording medium and data transfer is reduced.

Although the invention made by the present inventor has been described above specifically on the basis of the embodiment thereof, the present invention is not limited to the embodiment. Not to say, various modifications can be made without departing from the spirit and the scope of the invention.

For example, the data processing for expanding integer differential data, and carrying out the affine transformation and the perspective transformation upon expanded floating point differential data is not limited to the case where a processor also used for general-purpose control carries out the processing. The data processing may be carried out by a special-purpose processor such as a graphic processor or the like, or an accelerator. In addition, the specific configuration of the processor is not limited to that in FIG. 11, but it may be modified appropriately. In addition, the program for expanding compressed cluster data and carrying out the affine transformation and the perspective transformation upon expanded floating point differential data may be recorded and provided in a single recording medium or a plurality of recording media separately from the recording medium recording the compressed cluster data.

The effects obtained by representatives of the invention disclosed in this disclosure will be described below.

Since a data type which expresses polygons by use of differential data between vertex coordinates of a cluster and a reference point of the cluster is adopted, the size of image data can be reduced, and the capacity of a recording medium for recording the image data is not oppressed. In addition, the data type contributes to shortening of the transfer time of the image data.

Since a compression method is a type in which positional information of polygon vertexes expressed by floating points is converted into integer values, a complicated compression apparatus is not required, and the compression method can be dealt with by software easily.

Since the positional information of the polygon vertexes can be expressed by integer values of a predetermined size, the degree of compression of the data size after compression can be adjusted easily. In addition, since the compressed data has a regular structure, the compressed data can be expanded by simple data expansion means. Further, since the compressed data has a regular structure, the compressed data can be expanded easily by a processor which can execute an instruction having a memory access function and a data conversion function of an integer type to a floating point type.

Since a vertex close to a barycentric point of the respective vertex coordinates or the barycentric point itself can be set as the reference point for image compression, the values of differential data between the reference point and each vertex can be reduced easily without necessity of complicated compression calculation.

Affine transformation of vertexes constituting the expanded cluster is carried out by applying linear transformation in the affine transformation to differential vectors corresponding to the respective vertexes. Thus, the operation processing for the affine transformation can be reduced.

In perspective transformation of the respective vertexes contained in the cluster, approximation is made by the combination of multiplication and addition on the basis of values corresponding to the reference point. Thus, the division processing required for the perspective transformation can be reduced. This is effective in a processor in which time required for division is more than that for multiplication or addition.

Since an object to be subjected to the approximate calculation of the perspective transformation can be made selective, vertexes regarding precision as important and vertexes sufficient by the approximate processing can be selected. Thus, high-speed processing can be performed without deterioration in drawing quality.

The program for expanding the integer differential data or the data processing program for carrying out the affine transformation and the perspective transformation upon the expanded floating point differential data may be recorded and provided in a recording medium. In this case, the processing of the affine transformation and the perspective transformation on such cluster data can be carried out easily.

In addition, if the cluster data including the integer differential data is recorded and provided in a recording medium, the image processing can be performed with the recorded data. Thus, the expansion of the compressed data does not impose a heavy burden on the processing of the processor. In addition, the cost for the recording medium and the data transfer can be reduced.

What is claimed is:

1. A data processing method for compressing vertex coordinate data of a plurality of polygons approximating a three-dimensional shape of an image, comprising:
   a first step of dividing vertexes of said plurality of polygons approximating said three-dimensional shape of said image into a plurality of vertex sets;
   a second step of determining a reference point for each of said vertex sets;
   a third step of obtaining differential data between coordinates of each vertex and coordinates of a corresponding reference point as positional information of said vertex, for each of said vertex sets; and
   a fourth step of storing coordinate data of said reference point and said differential data as compressed data in each of said vertex sets.

2. A data processing method according to claim 1, wherein said coordinates of said vertexes and said coordinates of said reference point are provided as floating point data, and in said differential data obtained in said third step, a difference between coordinates of each vertex and coordinates of a corresponding reference point for each of said vertex sets is obtained as an integer value showing magnitude relative to a predetermined scale value.

3. A data processing method according to claim 1, wherein in said second step, for each of said vertex sets, a vertex close to a barycentric point obtained from coordinates of respective vertexes of said vertex set, or said barycentric point itself is set as a reference point for said vertex set.

4. A data processing method according to claim 2, wherein in said second step, for each of said vertex sets, a vertex close to a barycentric point obtained from coordinates of respective vertexes of said vertex set, or said barycentric point itself is set as a reference point for said vertex set.

5. A data processing method comprising:
a first step of inputting coordinate data of a reference point in a type of floating point number for a set of vertexes of a plurality of polygons approximating a three-dimensional shape of an image, differential data of a difference between coordinates of each of said vertexes and coordinates of said reference point in a type of integer, and scale value data for providing a reference of magnitude of said differential data in a type of floating point number;
a second step of type-converting said inputted differential data into floating point numbers;
a third step of multiplying said type-converted differential data by said scale value data; and
a fourth step of storing a multiplication result of said third step as expanded differential data.

6. A data processing apparatus comprising:
storage means which can store coordinate data of a reference point in a type of floating point number for a set of vertexes of a plurality of polygons approximating a three-dimensional shape of an image, differential data of a difference between coordinates of each of said vertexes and coordinates of said reference point in a type of integer, and scale value data for providing a reference of magnitude of said differential data in a type of floating point number; and
operation control means for receiving said differential data read out from said storage means, type-converting said received differential data into floating point numbers, multiplying said type-converted differential data by said scale value data, and outputting a multiplication result as expanded differential data.

7. A data processing apparatus according to claim 6, wherein said operation control means is a CPU, said CPU being able to execute an instruction to type-convert integer data into floating point number data, said instruction of type-conversion having a bit-length information field indicating bit length of said integer data.

8. A data processing method comprising the steps of:
inputting coordinate data of a reference point in a type of floating point number for a set of vertexes of a plurality of polygons approximating a three-dimensional shape of an image, and differential data of a difference between coordinates of each of said vertexes and coordinates of said reference point in a type of floating point number; and
carrying out affine transformation upon said inputted coordinate data of said reference point while linear transformation in which parallel displacement is excluded from said affine transformation is carried out upon coordinate data of said vertexes sharing said reference point.

9. A recording medium for recording a program readable by a computer, wherein:
said program makes said computer input coordinate data of a reference point in a type of floating point number for a set of vertexes of a plurality of polygons approximating a three-dimensional shape of an image, and differential data of a difference between coordinates of each of said vertexes and coordinates of said reference point in a type of floating point number; and said program makes said computer carry out affine transformation upon said inputted coordinate data of said reference point while linear transformation in which parallel displacement has been excluded from said affine transformation is carried out upon coordinate data of said vertexes sharing said reference point.

10. A data processing apparatus comprising:
storage means which can store coordinate data of a reference point in a type of floating point number for a set of vertexes of a plurality of polygons approximating a three-dimensional shape of an image, and differential data of a difference between coordinates of each of said vertexes and coordinates of said reference point in a type of floating point number; and
operation means for carrying out affine transformation upon said coordinate data of said reference point read out from said storage means while linear transformation in which parallel displacement is excluded from said affine transformation is carried out upon coordinate data of said vertexes sharing said reference point.

11. A data processing method comprising the steps of:
inputting coordinate data of a reference point in a type of floating point number for a set of vertexes of a plurality of polygons approximating a three-dimensional shape of an image, and differential data of a difference between coordinates of each of said vertexes and coordinates of said reference point in a type of floating point number; and
carrying out perspective transformation upon said vertexes of said plurality of polygons in such a manner that;
perspective transformation based on division using a geometric relationship of similarity is carried out upon said reference point so as to obtain perspective-transformed coordinate data of said reference point; and
perspective-transformed coordinate data of said vertexes other than said reference point is obtained by use of said perspective-transformed coordinate data of said reference point, and said differential data corresponding thereto in accordance with approximate calculation based on Maclaurin series expansion.

12. A data processing method according to claim 11, wherein in said approximate calculation for said perspective transformation, perspective transformation based on division using a geometric relationship of similarity is carried out upon said coordinate data of said vertexes other than said reference point when a distance between a coordinate origin and a perspective plane for said perspective transformation is smaller than a predetermined value.

13. A recording medium for recording a program readable by a computer, wherein:
said program makes said computer input coordinate data of a reference point in a type of floating point number for a set of vertexes of a plurality of polygons approximating a three-dimensional shape of an image, and differential data of a difference between coordinates of each of said vertexes and coordinates of said reference point in a type of floating point number; and said program makes said computer carry out perspective transformation upon said vertexes of said plurality of polygons in such a manner that perspective transformation based on division using a geometric relationship of similarity is carried out upon said inputted coordinate data of said reference point so as to obtain perspective-transformed coordinate data of said reference point, while approximate calculation for said perspective transformation is carried out upon said inputted coordinate data of said vertexes other than said reference point on the basis of Maclaurin series expansion using said perspective-transformed coordinate data of said reference point so as to obtain perspective-transformed coordinate data of said vertexes.

14. A data processing apparatus comprising:

storage means which can store coordinate data of a reference point in a type of floating point number for a set of vertexes of a plurality of polygons approximating a three-dimensional shape of an image, and differential data of a difference between coordinates of each of said vertexes and coordinates of said reference point in a type of floating point number; and operation means for carrying out perspective transformation upon said vertexes of said plurality of polygons in such a manner that perspective transformation based on division using a geometric relationship of similarity is carried out upon said coordinates of said reference point stored in said storage means so as to obtain perspective-transformed coordinate data of said reference point, while approximate calculation for said perspective transformation is carried out upon said coordinate data of said vertexes other than said reference point stored in said storage means on the basis of Maclaurin series expansion using said perspective-transformed coordinate data of said reference point so as to obtain perspective-transformed coordinate data of said vertexes when a distance between a perspective plane for said perspective transformation and said reference point is larger than a predetermined value, or while perspective transformation based on division using a geometric relationship of similarity is also carried out upon said coordinate data of said vertexes other than said reference point stored in said storage means so as to obtain perspective-transformed coordinate data of said vertexes when said distance between said perspective plane for said perspective transformation and said reference point is smaller than said predetermined value.

* * * * *